United States Patent
Lu

(10) Patent No.: US 11,043,975 B2
(45) Date of Patent: Jun. 22, 2021

(54) ENCODING METHOD, DECODING METHOD, APPARATUS, AND SYSTEM

(71) Applicant: HUAWEI TECHNOLOGIES CO., LTD., Shenzhen (CN)

(72) Inventor: Yuchun Lu, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/579,264

(22) Filed: Sep. 23, 2019

(65) Prior Publication Data

US 2020/0021313 A1 Jan. 16, 2020

Related U.S. Application Data

(63) Continuation of application No. PCT/CN2018/079511, filed on Mar. 20, 2018.

(30) Foreign Application Priority Data

Mar. 29, 2017 (CN) .......................... 201710195399.7

(51) Int. Cl.
*H03M 13/00* (2006.01)
*H03M 13/29* (2006.01)
*H03M 13/15* (2006.01)

(52) U.S. Cl.
CPC .................. *H03M 13/2906* (2013.01); *H03M 13/1515* (2013.01)

(58) Field of Classification Search
None
See application file for complete search history.

(56) References Cited

U.S. PATENT DOCUMENTS 6,622,277 B1 9/2003 Ramanujam et al.
7,146,553 B2 12/2006 Jarchi et al.
(Continued)

FOREIGN PATENT DOCUMENTS

CN 1691567 A 11/2005
CN 101309086 A 11/2008
(Continued)

OTHER PUBLICATIONS

Anonymous:"Optical Specifications of SMF PMDs Study", 400 Gb/s Ethernet Task Force, IEEE 802.3 Interim Meeting, Sep. 8-10, 2014. Ottawa, Canada, Chris Cole. Total 19 pages.
(Continued)

*Primary Examiner* — Mujtaba M Chaudry
(74) *Attorney, Agent, or Firm* — Stein IP, LLC

(57) ABSTRACT

This application provides an encoding method. The method includes: determining a frame of an outer code of to-be-encoded data, where the frame of the outer code includes a data information code and a check code of the data information code, the frame of the outer code is divided into Q data blocks, each data block in the Q data blocks includes W bits, and W and Q are integers greater than 0; and encoding the Q data blocks to obtain Q codewords of an inner code, where the Q data blocks are in a one-to-one correspondence with the Q codewords of the inner code, a first codeword in the Q codewords of the inner code includes a first data block and a check code of the first data block, the first codeword is any codeword in the Q codewords of the inner code.

20 Claims, 19 Drawing Sheets

(56) References Cited

U.S. PATENT DOCUMENTS

| | | | |
|---|---|---|---|
| 7,289,530 | B1 | 10/2007 | Yuan et al. |
| 8,136,020 | B2 | 3/2012 | Haas et al. |
| 8,689,089 | B2 | 4/2014 | Wang et al. |
| 9,015,549 | B2 | 4/2015 | Rub et al. |
| 9,602,235 | B2 | 3/2017 | Roh et al. |
| 2002/0166091 | A1 | 11/2002 | Kidorf et al. |
| 2004/0268209 | A1 | 12/2004 | Srivastava et al. |
| 2005/0210355 | A1 | 9/2005 | Itoh et al. |
| 2007/0043998 | A1* | 2/2007 | Lakkis ............... H03M 13/116 714/758 |
| 2007/0162831 | A1* | 7/2007 | Mizuochi ............ H03M 13/17 714/776 |
| 2009/0150746 | A1* | 6/2009 | Chaichanavong ........................ H03M 13/6561 714/752 |
| 2010/0241923 | A1 | 9/2010 | Wang et al. |
| 2010/0268918 | A1* | 10/2010 | Priewasser ........ H03M 13/6513 712/208 |
| 2011/0173511 | A1* | 7/2011 | Miyata ............... H03M 13/6577 714/755 |
| 2011/0214039 | A1* | 9/2011 | Steiner ............. H03M 13/2927 714/797 |
| 2014/0229801 | A1* | 8/2014 | Eroz ........................ H04L 1/00 714/776 |
| 2015/0381209 | A1 | 12/2015 | Roh et al. |
| 2016/0261280 | A1* | 9/2016 | Jeong ................. H03M 13/1165 |
| 2017/0366299 | A1 | 12/2017 | Li et al. |

FOREIGN PATENT DOCUMENTS

| | | |
|---|---|---|
| CN | 103916139 A | 7/2014 |
| CN | 105812107 A | 7/2016 |

OTHER PUBLICATIONS

Martin Langhammer et al. FEC Core Area Comparison and Model, P802.3bs 400Gb/s Ethernet Task Force. Oct. 2014. total 15 pages.
Sudeep Bhoja et al. FEC Codes for 400 Gbps 802.3bs, Nov. 2014. total 16 pages.
Sudeep Bhoja: "100G Single Lambda PAM4 PMD for 2km SMF", Jun. 11, 2014. total 19 pages.
Benjamin P. Smith et al. Journal of Lightwave Technology, vol. 30, No. 1, Jan. 1, 2012. pp. 110-117.
Michael Scholten et al. Continuously-Interleaved BCH (CI-BCH) FEC delivers best in class NECG for 40G and 100G metro applications, OSA / OFC/NFOEC 2010. total 3 pages.
Arash Farhood et al. 100GBase-PAM8 Baseline proposal update, IEEE Next Gen 100G Optical Ethernet Task Force. Jul. 2013. total 17 pages.
Vipul Bhatt et al. PAM8 and FEC Options, IEEE P802.3bm 40 Gb/s and 100 Gb/s Fiber Optic Task Force, Nov. 2012. total 18 pages.
Xinyuan Wang et al. FEC Options for Extended Reach of 50/200/400GbE, IEEE 802.3 NG-ECDC Ad Hoc, Mar. 2016. total 15 pages.
Tomoo Takahara et al. Discussion of 400GbE DMT level diagram for realistic implementation, IEEE802.3 Ottawa Interim meeting Sep. 2014.
Sacha Corbeil et al. Performance Results: High Gain FEC over DMT, JDSU, Nov. 18, 2014. total 7 pages.
Lee-Fang Wei: "Precoding Technique for Partial-Response Channels With Applications to HDTV Transmission", IEEE Journal on Selected Areas in Communications, IEEE Service Center, Piscataway, US, vol. 11, No. 1, Jan. 1, 1993(Jan. 1, 1993), pp. 127-135, XP000378004.

* cited by examiner

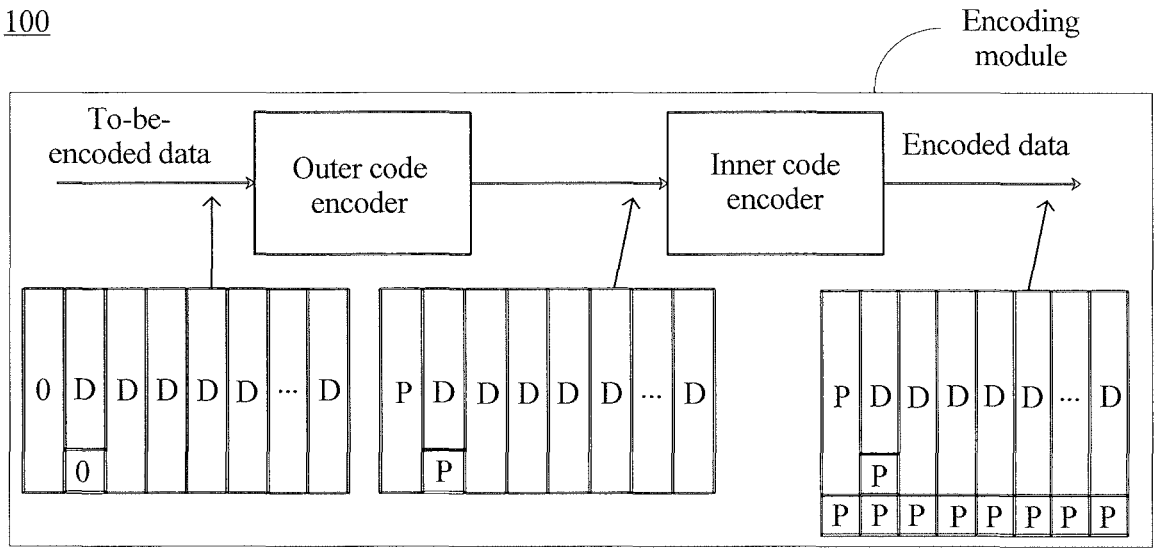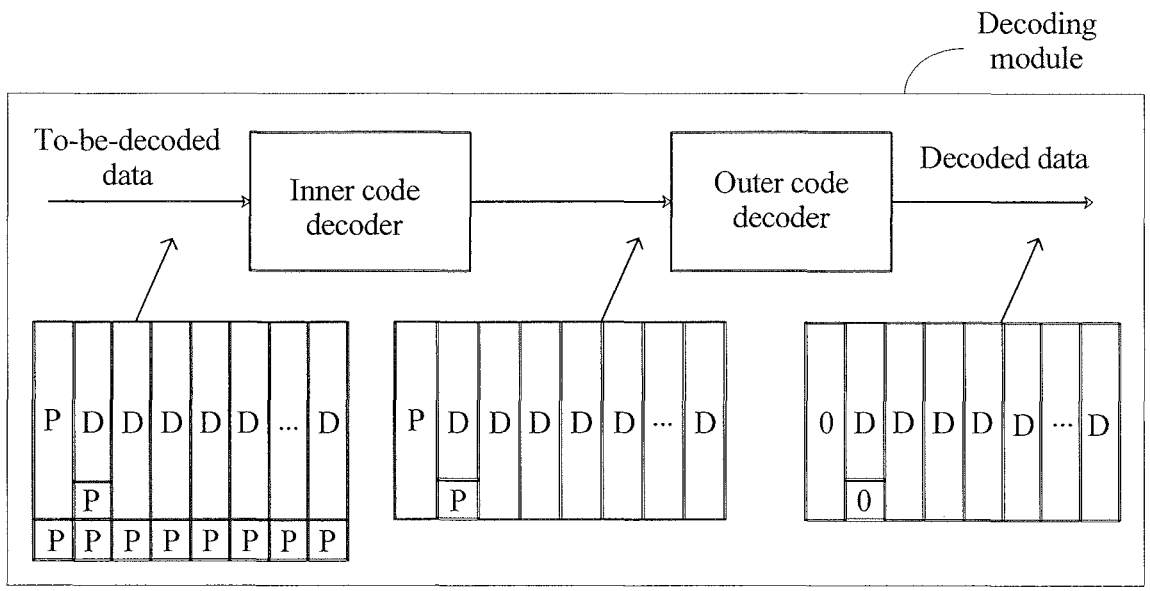
FIG. 1

200

Determine a frame of an outer code of to-be-encoded data, where the frame of the outer code includes a data information code and a check code of the data information code, the frame of the outer code is divided into Q data blocks, each data block in the Q data blocks includes W bits, and W and Q are integers greater than 0 — S201

Encode the Q data blocks to obtain Q codewords of an inner code, where the Q data blocks are in a one-to-one correspondence with the Q codewords of the inner code, a first codeword in the Q codewords of the inner code includes a first data block and a check code of the first data block, the first codeword is any codeword in the Q codewords of the inner code, and the first data block is a data block corresponding to the first codeword — S202

| | 0 | RS 0 | 159 | 160 | RS 1 | 319 | 320 | |
|---|---|---|---|---|---|---|---|---|
| 0 | | D | | | D | | P2 | |
| | | D | | | D | | P2 | |
| | | D | | | D | | P2 | |
| | | D | | | D | | P2 | |
| | | D | | | D | | P2 | |
| ⋮ | | ... | | | ... | | ... | |
| | | D | | | D | | P2 | |
| | | D | | | D | | P2 | |
| | | D | | | D | | P2 | |
| | | D | | | D | | P2 | |
| | D | P1 | | D | P1 | | P2 | ← Blank bit |
| 33 | | P1 | | | P1 | | P2 | |

ENCODING METHOD, DECODING METHOD, APPARATUS, AND SYSTEM

CROSS-REFERENCE TO RELATED APPLICATIONS

This application is a continuation of International Application No. PCT/CN2018/079511, filed on Mar. 20, 2018, which claims priority to Chinese Patent Application No. 201710195399.7, filed on Mar. 29, 2017, the disclosures of the aforementioned applications are hereby incorporated by reference in their entireties.

TECHNICAL FIELD

Aspects of this application relate to the field of encoding and decoding technologies, and in particular, to an encoding method, a decoding method, an apparatus, and a system.

BACKGROUND

As a rate of a high-speed communication link continuously increases, various damaging effects of a channel are gradually strengthened, and this causes a decrease to a signal-to-noise ratio. To improve bit error performance in a case of a low signal-to-noise ratio, a forward error correction (forward error correction, FEC) encoding and decoding technology gradually becomes a mandatory technology of the high-speed communication link. A requirement of the FEC encoding and decoding technology mainly features a high gain, a low delay, low complexity, and high compatibility.

To adapt to a communication link with a higher rate, how to obtain a high-performance FEC encoding and decoding technology when a gain, a delay, complexity, and high compatibility of FEC encoding and decoding are comprehensively considered is an urgent problem to be resolved in the industry.

SUMMARY

Aspects of this application provides an encoding method, a decoding method, an apparatus, and a system, to improve encoding and decoding efficiency.

According to a first aspect, an encoding method is provided, including: determining a frame of an outer code of to-be-encoded data, where the frame of the outer code includes a data information code and a check code of the data information code, the frame of the outer code is divided into Q data blocks, each data block in the Q data blocks includes W bits, and W and Q are integers greater than 0; and encoding the Q data blocks to obtain Q codewords of an inner code, where the Q data blocks are in a one-to-one correspondence with the Q codewords of the inner code, a first codeword in the Q codewords of the inner code includes a first data block and a check code of the first data block, the first codeword is any codeword in the Q codewords of the inner code, and the first data block is a data block corresponding to the first codeword. Here, the frame of the outer code comprises at least one, outer FEC code word, and each outer FEC code contains a data block (a data information code) and a parity block (check code).

In this embodiment of this application, the frame of the outer code is divided into Q data blocks whose lengths are W bits each, and the Q data blocks are encoded to obtain the Q codewords of the inner code, where a check code included in the first codeword in the Q codewords of the inner code includes only the check code of the first data block, so that encoding complexity can be reduced.

In this embodiment of this application, because the check code included in the first codeword in the Q codewords of the inner code includes only the check code of the first data block, in an encoding process, a codeword of the outer code may be input to an inner code encoder in a pipelining manner for encoding, so that a delay in the encoding process can be reduced.

In this embodiment of this application, the to-be-encoded data is encoded in a cascaded encoding manner, so that a bit error rate can be reduced, and error correction performance is improved. In addition, cascaded encoding is performed in a pipelining manner. Compared with an encoding manner with the same error correction performance, the pipelining manner can reduce an encoding delay and encoding complexity.

In this embodiment of this application, the to-be-encoded data is encoded in a cascaded encoding manner. The to-be-encoded data may be encoded only by using an outer code encoder with a lower gain, or the to-be-encoded data may be encoded with a higher gain in a cascaded encoding manner, so that encoding and decoding compatibility can be improved.

In a possible implementation, the method further includes: adding at least one blank bit to each frame of the Q codewords of the inner code, where the at least one blank bit is used to adjust an encoded codeword rate.

In this embodiment of this application, the at least one blank bit is filled in the inner code, to adjust an encoding and decoding rate, so that encoding and decoding efficiency is improved.

In a possible implementation, the method further includes: performing precoding based on the Q codewords of the inner code to obtain precoded data.

In a possible implementation, the determining a frame of an outer code of to-be-encoded data includes: obtaining the to-be-encoded data; and encoding the to-be-encoded data to obtain the frame of the outer code.

In a possible implementation, the outer code is a Reed Solomon RS code.

In a possible implementation, the frame of the outer code includes Y codewords of the RS code, Y*N*M=Q*W, N is a quantity of codeword symbols of the RS code, K is a quantity of information symbols of the RS (N, K) code, M is a quantity of bits included in each codeword symbol of the RS code, and Y, M, and N are integers greater than 0.

In a possible implementation, N=544, and K=514; or N=528, and K=514; or N=271, and K=257.

In a possible implementation, the inner code includes any one of the following: an RS code, a BCH code, and a convolutional code.

In a possible implementation, a value of W is any one of the following values: 160, 320, 480, and 640.

According to a second aspect, a decoding method is provided, including: obtaining Q codewords of an inner code of to-be-decoded data, where the Q codewords of the inner code are in a one-to-one correspondence with Q data blocks included in a frame of an outer code, a first codeword in the Q codewords of the inner code includes a first data block and a check code of the first data block, the first codeword is any codeword in the Q codewords of the inner code, and the first data block is a data block corresponding to the first codeword; decoding the Q codewords of the inner code to obtain the frame of the outer code, where the frame of the outer code is divided into the Q data blocks, each data block in the Q data blocks includes W bits, and W and Q are integers greater than 0; and decoding the frame of the outer code to obtain decoded data.

In this embodiment of this application, decoding is performed based on the Q codewords of the inner code to obtain the frame of the outer code, and the decoded data is obtained based on the frame of the outer code. The Q codewords of the inner code are in a one-to-one correspondence with Q data blocks included in the frame of the outer code. A check code included in the first codeword in the Q codewords of the inner code includes only the check code of the first data block, so that decoding complexity can be reduced.

In this embodiment of this application, because the check code included in the first codeword in the Q codewords of the inner code includes only the check code of the first data block, a speed of decoding the inner code is improved. After the inner code is decoded to obtain one frame of the outer code, the frame of the outer code may be input to an outer code encoder in a pipelining manner for decoding, so that a delay in an encoding process can be reduced.

In this embodiment of this application, the to-be-encoded data is encoded in a cascaded encoding manner, so that a bit error rate can be reduced, and error correction performance is improved. In addition, cascaded encoding is performed in a pipelining manner. Compared with an encoding manner with the same error correction performance, the pipelining manner can reduce an encoding delay and encoding complexity.

In this embodiment of this application, the to-be-decoded data is decoded in a cascaded decoding manner. The to-be-decoded data may be decoded only by using an outer code decoder with a lower gain, or the to-be-decoded data may be decoded with a higher gain in a cascaded decoding manner, so that encoding and decoding compatibility can be improved.

In a possible implementation, the Q codewords of the inner code further include at least one blank bit, and the at least one blank bit is used to adjust an encoded codeword rate.

In this embodiment of this application, the at least one blank bit is filled in the inner code, to adjust an encoding and decoding rate, so that encoding and decoding efficiency is improved.

In a possible implementation, before the obtaining Q codewords of an inner code of to-be-decoded data, the method further includes: obtaining the to-be-decoded data; and performing decoding processing on precoding of the to-be-decoded data to obtain the Q codewords of the inner code.

In a possible implementation, the outer code is a Reed Solomon RS code.

In a possible implementation, the frame of the outer code includes Y codewords of the RS code, Y*N*M=Q*W, N is a quantity of codeword symbols included in each codeword of the RS code, M is a quantity of bits included in each codeword symbol of the RS code, and Y, M, and N are integers greater than 0.

In a possible implementation, N=544, and K=514; or N=528, and K=514; or N=271, and K=257.

In a possible implementation, the inner code includes any one of the following: an RS code, a BCH code, and a convolutional code.

In a possible implementation, a value of W is any one of the following values: 160, 320, 480, and 640.

According to a third aspect, an encoding apparatus is provided, and the encoding apparatus includes a module configured to perform the method in the first aspect or various implementations of the first aspect.

According to a fourth aspect, a decoding apparatus is provided, and the decoding apparatus includes a module configured to perform the method in the second aspect or various implementations of the second aspect.

According to a fifth aspect, a communications system s provided, including the encoding apparatus according to the third aspect and the decoding apparatus according to the fourth aspect.

According to a sixth aspect, an encoding apparatus is provided, including a non-volatile storage medium and a central processing unit, where the non-volatile storage medium stores an executable program, and the central processing unit is connected to the non-volatile storage medium, and executes the executable program to implement the method in the first aspect.

According to a seventh aspect, a decoding apparatus is provided, including a non-volatile storage medium and a central processing unit, where the non-volatile storage medium stores an executable program, and the central processing unit is connected to the non-volatile storage medium, and executes the executable program to implement the method in the second aspect.

According to an eighth aspect, a communications system is provided, including the encoding apparatus according to the sixth aspect and the decoding apparatus according to the seventh aspect.

According to a ninth aspect, a computer readable medium is provided, the computer readable medium stores program code to be executed by a device, and the program code includes an instruction used to perform the method according to the first aspect.

According to a tenth aspect, a computer readable medium is provided, the computer readable medium stores program code to be executed by a device, and the program code includes an instruction used to perform the method according to the second aspect.

According to an eleventh aspect, a communications system is provided, including the encoding apparatus according to the ninth aspect and the decoding apparatus according to the tenth aspect.

BRIEF DESCRIPTION OF DRAWINGS

FIG. 1 is a schematic structural diagram of an encoding and decoding system according to an embodiment of this application;

FIG. 2 is a schematic flowchart of an encoding method according to an embodiment of this application;

FIG. 6 is a schematic structural diagram of a frame of a cascaded code according to still another embodiment of this application;

FIG. 7 is a schematic structural diagram of a frame of a cascaded code according to still another embodiment of this application;

FIG. 8 is a schematic structural diagram of a frame of a cascaded code according to still another embodiment of this application;

FIG. 9 is a schematic structural diagram of a frame of a cascaded code according to still another embodiment of this application;

FIG. 10 is a schematic structural diagram of a frame of a cascaded code according to still another embodiment of this application;

FIG. 13 is a schematic structural diagram of a frame of a cascaded code according to still another embodiment of this application;

FIG. 14 is a schematic structural diagram of a frame of a cascaded code according to still another embodiment of this application;

DESCRIPTION OF EMBODIMENTS

Figure 3:
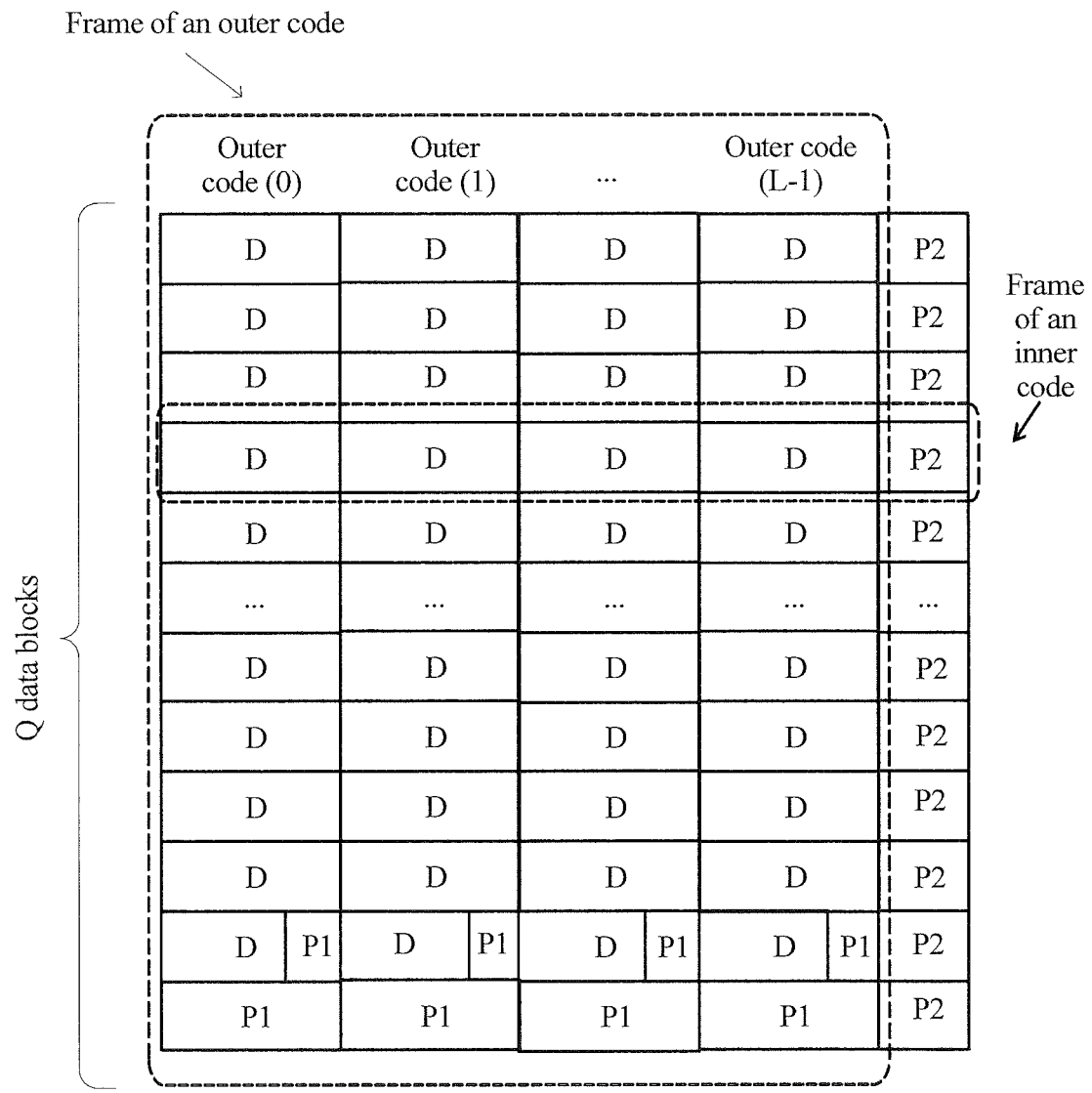
FIG. 3 is a schematic structural diagram of a frame of a cascaded code according to an embodiment of this application.

The following describes the technical solutions in this application with reference to the accompanying drawings.

The embodiments of this application provide an encoding method, a decoding method, an apparatus, and a system.

It should be understood that, the technical solutions of the embodiments of the present invention may be applied to various communications systems, such as: a global system for mobile communications (global system for mobile communications, GSM) system, a code division multiple access (code division multiple access, CDMA) system, a wideband code division multiple access (wideband code division multiple access, WCDMA) system, a general packet radio service (general packet radio service, GPRS), a long term evolution (long term evolution, LTE) system, an LTE frequency division duplex (frequency division duplex, FDD) system, LTE time division duplex (time division duplex, TDD), a universal mobile telecommunications system (universal mobile telecommunication system, UMTS), and a worldwide interoperability for microwave access (worldwide interoperability for microwave access, WiMAX) communications system.

It should be noted that the method for jointly encoding an outer code and an inner code in the embodiments of this application may also be referred to as cascaded encoding. A code obtained in a cascaded encoding manner may also be referred to as a cascaded code, or the cascaded code includes the foregoing outer code and the foregoing inner code.

FIG. 1 is a schematic structural diagram of an encoding and decoding system 100 according to an embodiment of this application. It should be understood that the encoding and decoding system and a scenario described in this embodiment of the present invention is intended to describe the technical solutions in the embodiments of the present invention more clearly, and do not constitute any limitation on the technical solutions provided in the embodiments of the present invention. A person of ordinary skill in the art may know that, with evolution and development of the encoding and decoding system, the technical solutions provided in the embodiments of the present invention are also applicable to similar technical problems.

An encoding module of the encoding and decoding system 100 in FIG. 1 includes an outer code encoder and an inner code encoder, and a decoding module of the encoding and decoding system 100 in FIG. 1 includes an outer code decoder and an inner code decoder. FIG. 1 shows a structure of an encoding and decoding system that includes one outer code encoder and one outer code decoder. A person skilled in the art may understand that the encoding and decoding system 100 in FIG. 1 may further include a plurality of outer code encoders and a plurality of outer code decoders. This is not limited in this embodiment of this application.

As shown in FIG. 1, in an encoding part, a to-be-encoded data stream is encoded by using the outer code encoder and the inner code encoder in turn, and an output of the outer code encoder is used as an input of the inner code encoder. Encoding of an outer code and an inner code may be completed in a pipelining manner. Alternatively, Inner code encoding and outer code encoding may be performed at the same time, and it is not necessary to perform inner code encoding after outer code encoding is completed.

Optionally, in a decoding part, after receiving a to-be-decoded data stream, the inner code decoder first performs inner code decoding. When an error quantity of the inner code decoding exceeds an error correction capability of the inner code decoder, the inner code decoder transmits, to the outer code decoder, received raw data obtained after an inner code check code is removed. After receiving the data transmitted by the inner code decoder, the outer code decoder starts to perform decoding error correction, to obtain decoded data.

FIG. 2 is a schematic flowchart of an encoding method 200 according to an embodiment of this application. As shown in FIG. 2, the method 200 includes the following steps.

S201. Determine a frame of an outer code of to-be-encoded data, where the frame of the outer code includes a data information code and a check code of the data information code, the frame of the outer code is divided into Q data blocks, each data block in the Q data blocks includes W bits, and W and Q are integers greater than 0. Here, the frame of the outer code comprises at least one outer FEC code word, and each outer FEC code contains a data block (a data information code) and a parity block (check code).

Optionally, the frame of the outer code may be a frame of an outer code that is directly obtained and that has been encoded. Alternatively, the to-be-encoded data may be obtained, and is encoded to obtain the frame of the outer code.

Optionally, the outer code may be a Reed Solomon (Reed Solomon, RS) code, or may be another type of error-correcting code. This is not limited in this embodiment of this application.

Optionally, the outer code may include a data information code and a check code, and the check code is used to check the data information code.

S202. Encode the Q data blocks to obtain Q codewords of an inner code, where the Q data blocks are in a one-to-one correspondence with the Q codewords of the inner code, and a first codeword in the Q codewords of the inner code includes a first data block and a check code of the first data block, the first codeword is any codeword in the Q codewords of the inner code, and the first data block is a data block corresponding to the first codeword.

It should be noted that a check code of the first codeword of the inner code includes only the check code of the first data block. Therefore, an encoding sequence of Q Inner codes does not affect an encoding result of the inner code. In other words, the Q codewords of the inner code may be synchronously encoded, or may be sequentially encoded, or may be encoded in another non-synchronous manner. In other words, before the frame of the outer code is completely output to the inner code encoder, the inner code encoder may perform encoding in synchronization with the outer code encoder, so that a delay in an encoding process is reduced.

For example, in an outer code encoding process, the outer code encoder may output, in a pipelining manner, a codeword that is of the outer code and that has been encoded, and the inner code encoder may receive the codeword of the outer code in a pipelining manner, and encode the Q data blocks to obtain the Q codewords of the inner code.

Optionally, the frame of the outer code may include one frame of the outer code. The one frame of the outer code may include one codeword of the outer code, or may include a plurality of codewords of the outer code.

Optionally, the outer code may be divided into the Q data blocks in a plurality of division manners. For example, bits or symbols formed by a plurality of codewords of the outer code may be arranged at random, for example, the plurality of codewords of the outer code may be arranged in sequence, or may be arranged in an interleaved manner. This is not limited in this embodiment of this application.

In a specific example, FIG. 3 is a schematic structural diagram of a frame of a cascaded code according to an embodiment of this application. One frame of an outer code in FIG. 3 includes L codewords of the outer code, codeword symbols or bits included in the L codewords of the outer code are divided into Q data blocks, and each data block in the Q data blocks may be used as a data information code of an inner code for encoding. A generated check code may be attached after the data information code to form a codeword of the inner code. L is an integer greater than 0. In the example of FIG. 3, D represents a data information code, P1 represents a check code of the outer code, and P2 represents a check code of the inner code.

In this embodiment of this application, the frame of the outer code is divided into the Q data blocks whose lengths are W bits each, and the Q data blocks are encoded to obtain the Q codewords of the inner code. The check code included in the first codeword in the Q codewords of the inner code includes only the check code of the first data block, so that encoding complexity can be reduced.

In this embodiment of this application, because the check code included in the first codeword in the Q codewords of the inner code includes only the check code of the first data block, in an encoding process, a codeword of the outer code may be input to the inner code encoder in a pipelining manner for encoding, so that a delay in the encoding process can be reduced.

In this embodiment of this application, the to-be-encoded data is encoded in a cascaded encoding manner, so that a bit error rate can be reduced, and error correction performance is improved. In addition, cascaded encoding is performed in a pipelining manner. Compared with an encoding manner with the same error correction performance, the pipelining manner can reduce an encoding delay and encoding complexity.

In this embodiment of this application, the to-be-encoded data is encoded in a cascaded encoding manner. The to-be-encoded data may be encoded only by using the outer code encoder with a lower gain, or the to-be-encoded data may be encoded with a higher gain in a cascaded encoding manner, so that encoding and decoding compatibility can be improved.

Therefore, the encoding and decoding method provided in this embodiment of this application can ensure an encoding and decoding gain, reduce a delay and complexity of encoding and decoding, and improve encoding and decoding compatibility.

Optionally, to adjust a rate of an encoded data stream, at least one blank bit may be filled in the inner code. The at least one blank bit may be used to be filled with invalid data, or may be used to be filled with valid information. For example, the at least one blank bit may be used for channel management.

In an example, a quantity of blank bits included in the inner code may be selected based on an actual link rate. A criterion for selecting a quantity of blank bits may be: A ratio of a codeword length of the inner code obtained after the blank bits are added to a data information bit length is obtained, and a quantity of blank bits should enable a numerator and a denominator of a minimum divisor of the ratio to be as small as possible, so as to simplify a clock used in the encoding and decoding process and adapt to the actual link rate.

In this embodiment of this application, at least one blank bit is filled in the inner code, to adjust an encoding and decoding rate, so that encoding and decoding efficiency is improved.

Optionally, after the Q codewords of the inner code are obtained, the method 200 further includes: generating a to-be-sent signal based on the Q codewords of the inner code.

Specifically, the generating a to-be-sent signal based on the Q codewords of the inner code may include a plurality of processing manners. The embodiments of this application set no limit thereto. For example, interleaving, channel encoding, and mapping may be performed on the Q codewords of the inner code to generate the to-be-sent signal.

Optionally, the method 200 further includes: performing precoding based on the Q codewords of the inner code to obtain precoded data, and generating the to-be-sent signal based on the precoded data.

In this embodiment of this application, when a burst channel exists, the Q codewords of the inner code may be precoded, and then the to-be-sent signal is generated based on the precoded data, so that bit error performance of cascaded encoding can be improved.

In a specific example, the Q codewords of the inner code may be input to a 1/(1+D) MOD X precoder for precoding processing. D represents a delay of a symbol unit of a digital filter, MOD represents a modulo division operation, and X represents an order of the modulo division operation. For example, when PAM-4 modulation is used, X=4.

Optionally, the frame of the outer code may include Y codewords of the RS code, Y*N*M=Q*W, N is a quantity of codeword symbols of the RS code, K is a quantity of information symbols of the RS (N, K) code, M is a quantity of bits included in each codeword symbol of the RS code, and Y, M, and N are integers greater than 0. The RS code may be represented as RS (N, K).

Optionally, in the outer code RS (N, K), N=544, and K=514; or N=528, and K=514; or N=271, and K=257. For example, the outer code may include RS (544, 514), RS (528, 514), or RS (271,257).

Optionally, a value of W is any one of the following values: 160, 320, 480, and 640. In other words, a quantity of bits of the data information code of the inner code may be 160, 320, 480, or 640. For example, for selection of the inner code, refer to content listed in the following Table 1 to Table 8.

Figure 4:
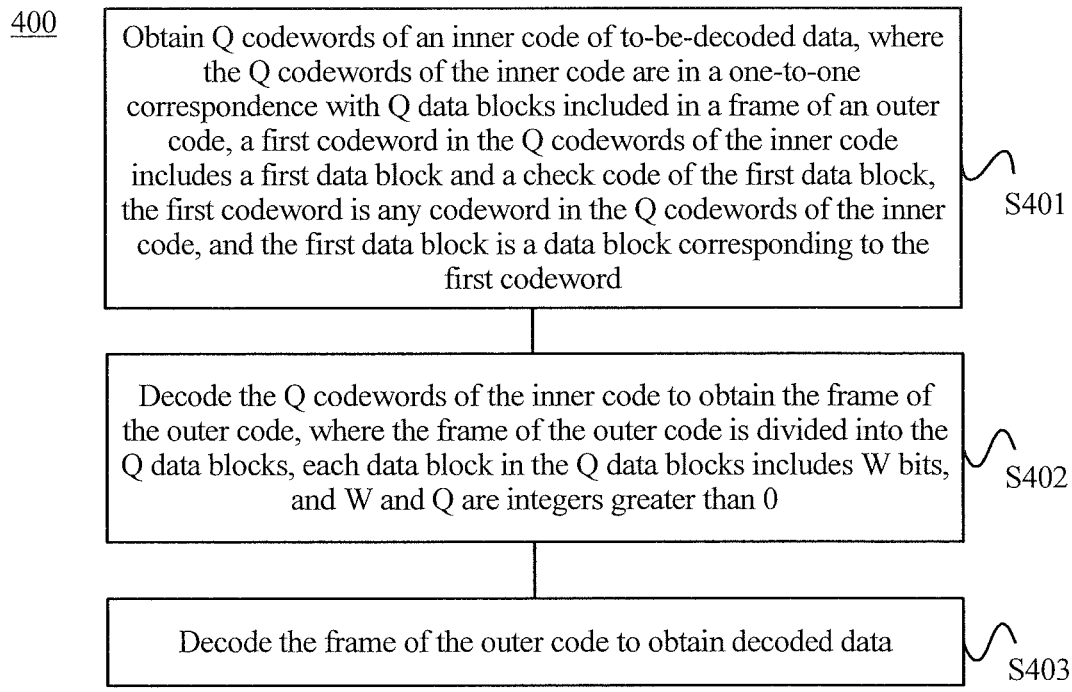
FIG. 4 is a schematic flowchart of a decoding method according to an embodiment of this application.

The foregoing describes the encoding method in the embodiments of this application, and the following describes a decoding method 400 in the embodiments of this application. FIG. 4 is a schematic flowchart of a decoding method according to an embodiment of this application. For brevity, content in the method in FIG. 4 that is the same as or similar to that in the foregoing description is not described herein again. The decoding method 400 includes the following steps.

S401. Obtain Q codewords of an inner code of to-be-decoded data, where the Q codewords of the inner code are in a one-to-one correspondence with Q data blocks included in a frame of an outer code, a first codeword in the Q codewords of the inner code includes a first data block and a check code of the first data block, the first codeword is any codeword in the Q codewords of the inner code, and the first data block is a data block corresponding to the first codeword.

S402. Decode the Q codewords of the inner code to obtain the frame of the outer code, where the frame of the outer code is divided into the Q data blocks, each data block in the Q data blocks includes W bits, and W and Q are integers greater than 0.

Optionally, the outer code is an RS code.

S403. Decode the frame of the outer code to obtain decoded data.

In this embodiment of this application, decoding is performed based on the Q codewords of the inner code to obtain the frame of the outer code, and the decoded data is obtained based on the frame of the outer code. The Q codewords of the inner code are in a one-to-one correspondence with the Q data blocks included in the frame of the outer code. A check code included in the first codeword in the Q codewords of the inner code includes only the check code of the first data block, so that decoding complexity can be reduced.

In this embodiment of this application, because the check code included in the first codeword in the Q codewords of the inner code includes only the check code of the first data block, a speed of decoding the inner code is improved. After the inner code is decoded to obtain one frame of the outer code, the frame of the outer code may be input to an outer code encoder in a pipelining manner for decoding, so that a delay in an encoding process can be reduced.

In this embodiment of this application, the to-be-encoded data is encoded in a cascaded encoding manner, so that a bit error rate can be reduced, and error correction performance is improved. In addition, cascaded encoding is performed in a pipelining manner. Compared with an encoding manner with the same error correction performance, the pipelining manner can reduce an encoding delay and encoding complexity.

In this embodiment of this application, the to-be-decoded data is decoded in a cascaded decoding manner. The to-be-decoded data may be decoded only by using the outer code decoder with a lower gain, or the to-be-decoded data may be decoded with a higher gain in a cascaded decoding manner, so that encoding and decoding compatibility can be improved.

Therefore, the encoding and decoding method provided in this embodiment of this application can ensure an encoding and decoding gain, reduce a delay and complexity of encoding and decoding, and improve encoding and decoding compatibility.

Optionally, in the method 400, the Q codewords of the inner code further include at least one blank bit, and the at least one blank bit is used to adjust a rate of a codeword obtained after cascaded encoding.

Optionally, in the method 400, before the obtaining Q codewords of an inner code of the to-be-decoded data, the method further includes: obtaining the to-be-decoded data; and performing decoding processing on precoding of the to-be-decoded data to obtain the Q codewords of the inner code.

Optionally, in the method 400, the frame of the outer code includes Y codewords of the RS code, and Y*N*M=Q*W, where N is a quantity of codeword symbols included in each codeword of the RS code, M is a quantity of bits included in each codeword symbol of the RS code, and Y, M, and N are integers greater than 0.

Optionally, in the method 400, N=544, and K=514; or N=528, and K=514; or N=271, and K=257.

Optionally, in the method 400, the inner code includes any one of the following: an RS code, a BCH code, and a convolutional code.

Optionally, in the method 400, a value of W is any one of the following values: 160, 320, 480, and 640.

In this embodiment of this application, the value of W may also be any other value. This is not limited in this embodiment of this application.

The following describes specific embodiments of the encoding method and the decoding method in the embodiments of this application with reference to the accompanying drawings.

Figure 5:
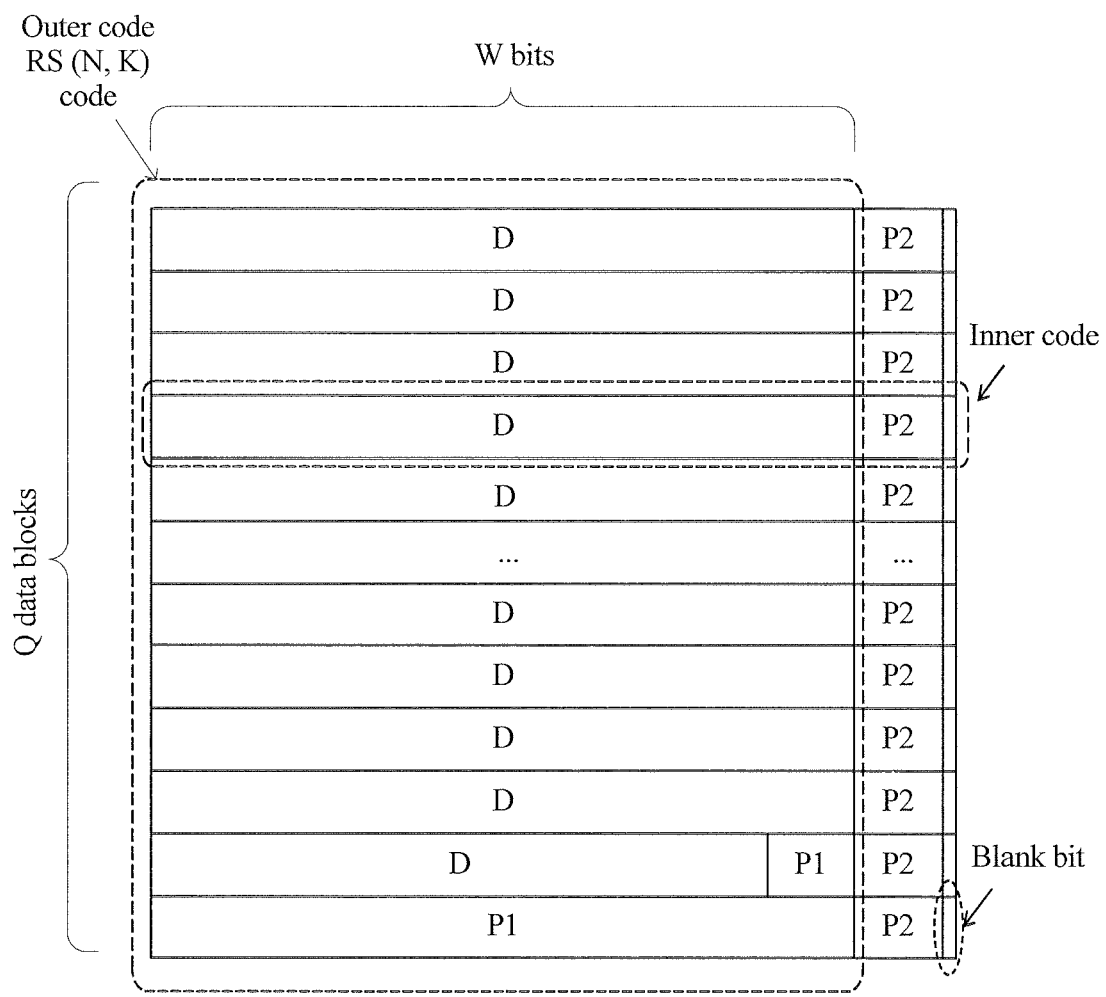
FIG. 5 is a schematic structural diagram of a frame of a cascaded code according to another embodiment of this application.

FIG. 5 is a schematic structural diagram of a frame of a cascaded code according to an embodiment of this application. In FIG. 5, D represents a data information code of an outer code, P1 represents a check code of the outer code, and P2 represents a check code of an inner code. As shown in FIG. 5, the outer code in the figure is an RS (N, K) code. In the frame of the cascaded code, P RS codewords are divided into Q data blocks whose lengths are W bits each. P*N*M=Q*W, where M is a quantity of bits included in each codeword symbol of the RS code. Each data block is used as a data information code of an inner code and encoded to generate a check code. The check code may be attached after each data block to form a codeword of the inner code. Optionally, to adjust a rate of an encoded data stream, appropriate blank bits can be added after the codeword of the inner code. The blank bit may be permanently filled with invalid data, or may be filled with valid information. For example, the valid information is used for channel management. Optionally, the codeword of the inner code may include any one of the following: a BCH code, an RS code, and a convolutional code.

Optionally, one frame of the outer code in FIG. 5 may consist of one RS codeword, or may consist of a plurality of RS codewords. For example, the frame of the outer code may consist of L RS codewords, and L is a positive integer greater than or equal to 1. Bits or codeword symbols formed by the L RS codewords in the frame of the outer code may be arranged at random, may be arranged in sequence, or may be arranged in an interleaved manner.

Figures 6, 7:
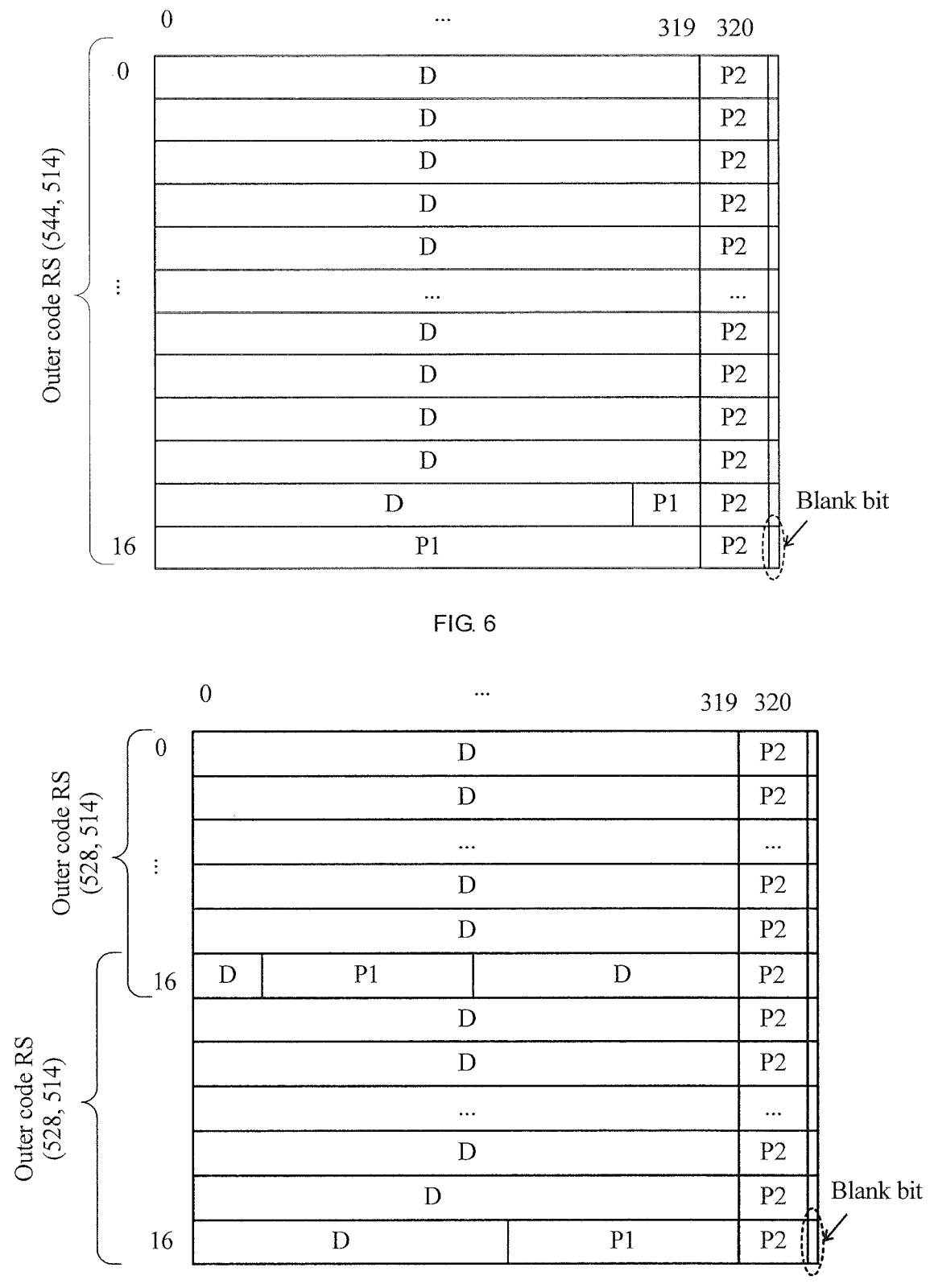

FIG. 6 to FIG. 8 are schematic structural diagrams of a frame of a cascaded code according to still another embodiment of this application. In FIG. 6 to FIG. 8, D represents a data information code of an outer code, P1 represents a check code of the outer code, and P2 represents a check code of an inner code. A quantity of bits of a data information code of each codeword of the inner code in FIG. 6 to FIG. 8 is 320 bits.

One frame of the outer code in FIG. 6 includes one codeword of an RS (544, 514) code. The RS (544, 514) codeword is divided by using W=320 bits as a granularity, and one frame of the RS (544, 514) code is exactly divided into Q=17 data blocks whose lengths are W=320 bits each.

One frame of the outer code in FIG. 7 includes two codewords of an RS (528, 514) code. One frame of the RS (528, 514) code is exactly divided into Q=33 data blocks whose lengths are W=320 bits each.

One frame of the outer code in FIG. 8 includes two codewords of an RS (544, 514) code. One frame of the RS (544, 514) code is exactly divided into Q=34 data blocks whose lengths are W=320 bits each.

In a specific example, the inner code in the examples in FIG. 6 to FIG. 8 may be a BCH (n, x, t, m) code shown in Table 1, or an RS (N, K, T, M) code shown in Table 2. A length of a data information code of each codeword of the BCH code in Table 1 and the RS code in Table 2 is 320 bits.

In this embodiment of this application, n represents a codeword length of each codeword, x represents a quantity of bits of a data information code in each codeword, t represents a quantity of bits that can be corrected in each codeword, m represents a dimension of a finite field of a codeword, N represents a quantity of codeword symbols of each codeword, K represents a quantity of codeword symbols of a data information code of each codeword, T represents a quantity of codeword symbols that can be corrected in each codeword, and M represents a quantity of bits of a codeword symbol of each codeword. OH represents a proportion of check codes or overheads.

Optionally, a quantity of blank bits included in the inner code may be selected based on an actual link rate. A criterion for selecting a quantity of blank bits may be: A ratio of a codeword length of the inner code obtained after the blank bits are added to a data information bit length is obtained, and a quantity of blank bits should enable a numerator and a denominator of a minimum divisor of the ratio to be as small as possible, so as to simplify a dock used in the encoding and decoding process and adapt to the actual link rate. For example, when a BCH (356, 320, 4) code is selected as the inner code, four blank bits may be added after each BCH code, and an entire BCH data frame is supplemented to 360 bits. In this case, the ratio of the codeword length of the inner code to the data information bit length is 360/320=9/8.

TABLE 1

| BCH (n, x, t, m) | | | | |
|---|---|---|---|---|
| n | x | t | m | OH |
| 338 | 320 | 2 | 9 | 5.63% |
| 347 | 320 | 3 | 9 | 8.44% |
| 356 | 320 | 4 | 9 | 11.25% |

TABLE 1-continued

| BCH (n, x, t, m) | | | | |
|---|---|---|---|---|
| n | x | t | m | OH |
| 365 | 320 | 5 | 9 | 14.06% |
| 374 | 320 | 6 | 9 | 16.88% |
| 383 | 320 | 7 | 9 | 19.69% |
| 392 | 320 | 8 | 9 | 22.50% |
| 401 | 320 | 9 | 9 | 25.31% |
| 410 | 320 | 10 | 9 | 28.13% |
| 419 | 320 | 11 | 9 | 30.94% |
| 428 | 320 | 12 | 9 | 33.75% |

TABLE 2

| RS (N, K, T, M) | | | | | | |
|---|---|---|---|---|---|---|
| N | K | T | M | n | x | OH |
| 42 | 40 | 1 | 8 | 336 | 320 | 5.00% |
| 44 | 40 | 2 | 8 | 352 | 320 | 10.00% |
| 46 | 40 | 3 | 8 | 368 | 320 | 15.00% |
| 48 | 40 | 4 | 8 | 384 | 320 | 20.00% |
| 50 | 40 | 5 | 8 | 400 | 320 | 25.00% |
| 52 | 40 | 6 | 8 | 416 | 320 | 30.00% |
| 54 | 40 | 7 | 8 | 432 | 320 | 35.00% |
| ... | ... | ... | ... | ... | ... | ... |
| 34 | 32 | 1 | 10 | 340 | 320 | 6.25% |
| 36 | 32 | 2 | 10 | 360 | 320 | 12.50% |
| 38 | 32 | 3 | 10 | 380 | 320 | 18.75% |
| 40 | 32 | 4 | 10 | 400 | 320 | 25.00% |
| 42 | 32 | 5 | 10 | 420 | 320 | 31.25% |
| 44 | 32 | 6 | 10 | 440 | 320 | 37.50% |
| ... | ... | ... | ... | ... | ... | ... |

Figures 9, 10:
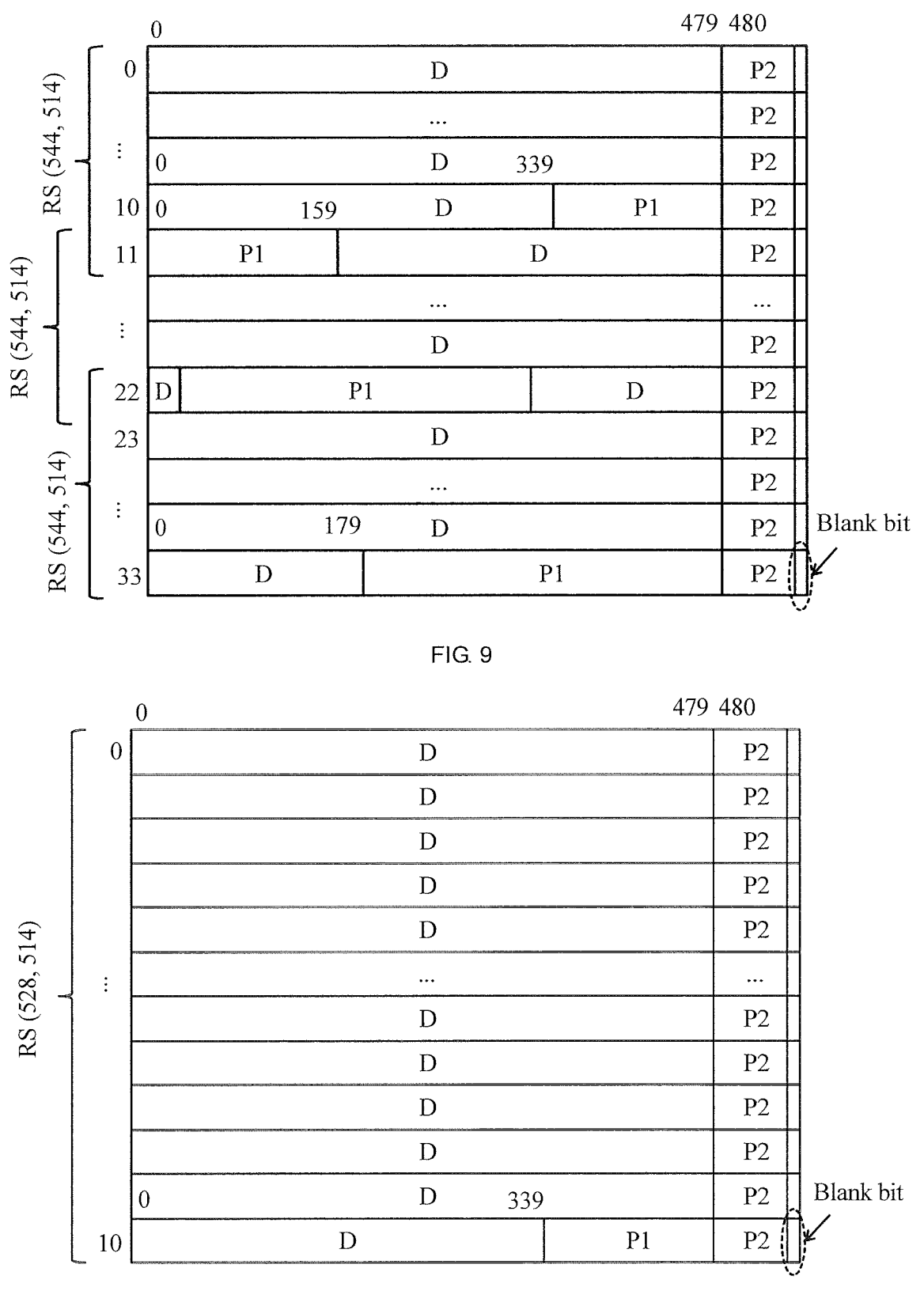

FIG. 9 or FIG. 10 is a schematic structural diagram of a frame of a cascaded code according to still another embodiment of this application. In FIG. 9 or FIG. 10, D represents a data information code of an outer code, P1 represents a check code of the outer code, and P2 represents a check code of an inner code. A quantity of bits of a data information code of each codeword of the inner code in FIG. 9 or FIG. 10 is 480 bits.

One frame of the outer code in FIG. 9 includes three codewords of an RS (544, 514) code. The RS (544, 514) codewords are divided by using W=480 bits as a granularity, and one frame of the RS (544, 514) code is exactly divided into Q=34 data blocks whose lengths are W=480 bits each.

One frame of the outer code in FIG. 10 includes one codeword of an RS (528, 514) code. One frame of the RS (528, 514) code is exactly divided into Q=11 data blocks whose lengths are W=480 bits each.

In a specific example, the inner code in the examples in FIG. 9 or FIG. 10 may be a BCH (n, x, t, m) code shown in Table 3, or an RS (N, K, T, M) code shown in Table 4. A length of a digital information code of each codeword of the BCH code in Table 3 and the RS code in Table 4 is 480 bits.

In this embodiment of this application, n represents a codeword length of each codeword, x represents a quantity of bits of a data information code in each codeword, t represents a quantity of bits that can be corrected in each codeword, m represents a dimension of a finite field of a codeword, N represents a quantity of codeword symbols of each codeword, K represents a quantity of codeword symbols of a data information code of each codeword, T represents a quantity of codeword symbols that can be corrected in each codeword, and M represents a quantity of bits of a codeword symbol of each codeword. OH represents a proportion of check codes or overheads.

In an example, a quantity of blank bits included in the inner code may be selected based on an actual link rate. For example, when a BCH (540, 480, 6) code is selected as the inner code, 0 blank bits may be added after each BCH code. In this case, a ratio of a codeword length of the inner code to a data information bit length is 360/320=9/8.

TABLE 3

BCH (n, x, t, m)

| n | x | t | m | OH |
|---|---|---|---|---|
| 500 | 480 | 2 | 10 | 4.17% |
| 510 | 480 | 3 | 10 | 6.25% |
| 520 | 480 | 4 | 10 | 8.33% |
| 530 | 480 | 5 | 10 | 10.42% |
| 540 | 480 | 6 | 10 | 12.50% |
| 550 | 480 | 7 | 10 | 14.58% |
| 560 | 480 | 8 | 10 | 16.67% |
| 570 | 480 | 9 | 10 | 18.75% |
| 580 | 480 | 10 | 10 | 20.83% |
| 590 | 480 | 11 | 10 | 22.92% |
| 600 | 480 | 12 | 10 | 25.00% |
| 610 | 480 | 13 | 10 | 27.08% |
| 620 | 480 | 14 | 10 | 29.17% |
| 630 | 480 | 15 | 10 | 31.25% |
| 640 | 480 | 16 | 10 | 33.33% |
| 645 | 480 | 17 | 10 | 34.38% |
| 655 | 480 | 18 | 10 | 36.46% |

TABLE 4

RS (N, K, T, M)

| N | K | T | M | n | x | OH |
|---|---|---|---|---|---|---|
| 62 | 60 | 1 | 8 | 496 | 480 | 3.33% |
| 64 | 60 | 2 | 8 | 512 | 480 | 6.67% |
| 66 | 60 | 3 | 8 | 528 | 480 | 10.00% |
| 68 | 60 | 4 | 8 | 544 | 480 | 13.33% |
| 70 | 60 | 5 | 8 | 560 | 480 | 16.67% |
| 72 | 60 | 6 | 8 | 576 | 480 | 20.00% |
| 74 | 60 | 7 | 8 | 592 | 480 | 23.33% |
| 76 | 60 | 8 | 8 | 608 | 480 | 26.67% |
| 78 | 60 | 9 | 8 | 624 | 480 | 30.00% |
| 80 | 60 | 10 | 8 | 640 | 480 | 33.33% |
| ... | ... | ... | ... | ... | ... | ... |
| 50 | 48 | 1 | 10 | 500 | 480 | 4.17% |
| 52 | 48 | 2 | 10 | 520 | 480 | 8.33% |
| 54 | 48 | 3 | 10 | 540 | 480 | 12.50% |
| 56 | 48 | 4 | 10 | 560 | 480 | 16.67% |
| 58 | 48 | 5 | 10 | 580 | 480 | 20.83% |
| 60 | 48 | 6 | 10 | 600 | 480 | 25.00% |
| 62 | 48 | 7 | 10 | 620 | 480 | 29.17% |
| 64 | 48 | 8 | 10 | 640 | 480 | 33.33% |
| ... | ... | ... | ... | ... | ... | ... |

Figure 11:
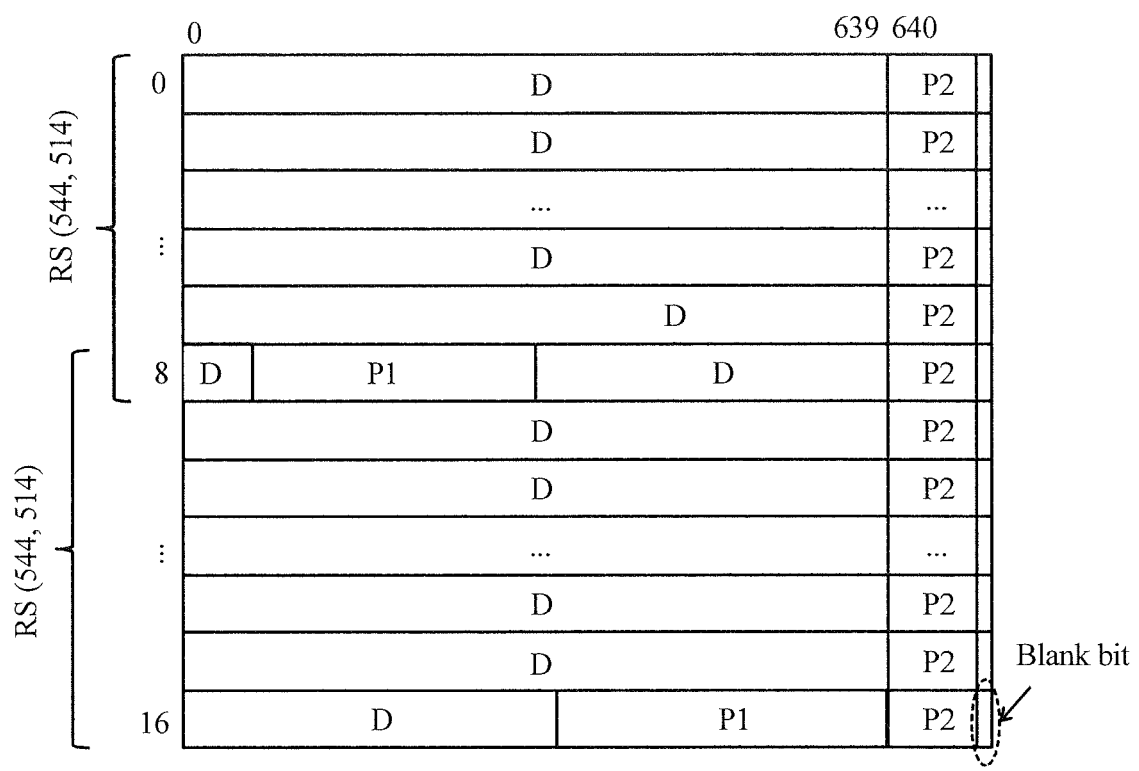
FIG. 11 is a schematic structural diagram of a frame of a cascaded code according to still another embodiment of this application.
Figure 12:
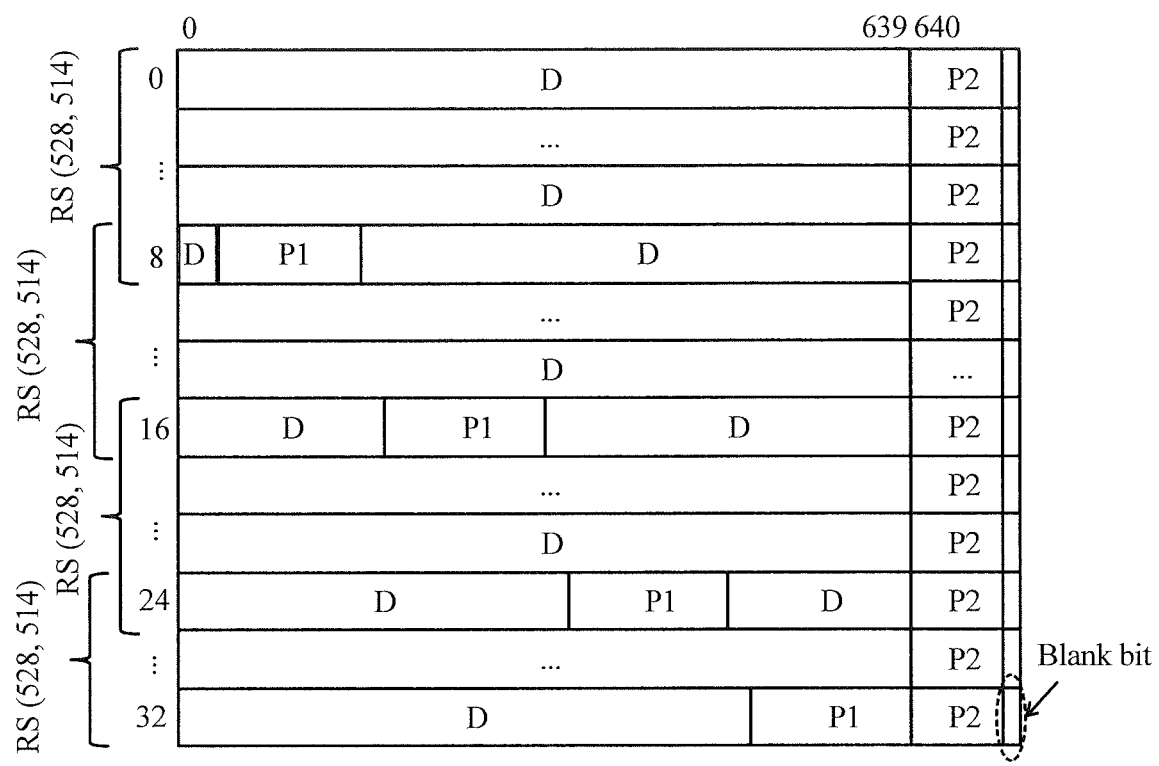
FIG. 12 is a schematic structural diagram of a frame of a cascaded code according to still another embodiment of this application.

FIG. 11 or FIG. 12 is a schematic structural diagram of a frame of a cascaded code according to still another embodiment of this application. In FIG. 11 or FIG. 12, D represents a data information code of an outer code, P1 represents a check code of the outer code, and P2 represents a check code of an inner code. A quantity of bits of a data information code of each codeword of the inner code in FIG. 11 or FIG. 12 is 640 bits.

One frame of the outer code in FIG. 11 includes two codewords of an RS (544, 514) code. The RS (544, 514) codewords are divided by using W=640 bits as a granularity, and one frame of the RS (544, 514) code is exactly divided into Q=17 data blocks whose lengths are W=640 bits each.

One frame of the outer code in FIG. 12 includes four codewords of an RS (528, 514) code. One frame of the RS (528, 514) code is exactly divided into Q=33 data blocks whose lengths are W=640 bits each.

In a specific example, the inner code in the examples in FIG. 11 or FIG. 12 may be a BCH (n, x, t, m) code shown in Table 5, or an RS (N, K, T. M) code shown in Table 6. A length of a digital information code of each codeword of the BCH code in Table 5 and the RS code in Table 6 is 640 bits.

In this embodiment of this application, n represents a codeword length of each codeword, x represents a quantity of bits of a data information code in each codeword, t represents a quantity of bits that can be corrected in each codeword, m represents a dimension of a finite field of a codeword, N represents a quantity of codeword symbols of each codeword, K represents a quantity of codeword symbols of a data information code of each codeword, T represents a quantity of codeword symbols that can be corrected in each codeword, and M represents a quantity of bits of a codeword symbol of each codeword. OH represents a proportion of check codes or overheads.

In an example, a quantity of blank bits included in the inner code may be selected based on an actual link rate. For example, when a BCH (720, 640, 8) code is selected as the inner code, 0 blank bits may be added after each BCH code. In this case, a ratio of a codeword length of the inner code to a data information bit length is 720/640=9/8.

TABLE 5

BCH (n, x, t, m)

| n | x | t | m | OH |
|---|---|---|---|---|
| 660 | 640 | 2 | 10 | 3.13% |
| 670 | 640 | 3 | 10 | 4.69% |
| 680 | 640 | 4 | 10 | 6.25% |
| 690 | 640 | 5 | 10 | 7.81% |
| 700 | 640 | 6 | 10 | 9.38% |
| 710 | 640 | 7 | 10 | 10.94% |
| 720 | 640 | 8 | 10 | 12.50% |
| 730 | 640 | 9 | 10 | 14.06% |
| 740 | 640 | 10 | 10 | 15.63% |
| 750 | 640 | 11 | 10 | 17.19% |
| 760 | 640 | 12 | 10 | 18.75% |
| 770 | 640 | 13 | 10 | 20.31% |
| 780 | 640 | 14 | 10 | 21.88% |
| 790 | 640 | 15 | 10 | 23.44% |
| 800 | 640 | 16 | 10 | 25.00% |
| 805 | 640 | 17 | 10 | 25.78% |
| 815 | 640 | 18 | 10 | 27.34% |
| 825 | 640 | 19 | 10 | 28.91% |
| 835 | 640 | 20 | 10 | 30.47% |
| 845 | 640 | 21 | 10 | 32.03% |
| 855 | 640 | 22 | 10 | 33.59% |
| 865 | 640 | 23 | 10 | 35.16% |

TABLE 6

RS (N, K, T, M)

| N | K | T | M | n | x | OH |
|---|---|---|---|---|---|---|
| 82 | 80 | 1 | 8 | 656 | 640 | 2.50% |
| 84 | 80 | 2 | 8 | 672 | 640 | 5.00% |
| 86 | 80 | 3 | 8 | 688 | 640 | 7.50% |
| 88 | 80 | 4 | 8 | 704 | 640 | 10.00% |
| 90 | 80 | 5 | 8 | 720 | 640 | 12.50% |
| 92 | 80 | 6 | 8 | 736 | 640 | 15.00% |
| 94 | 80 | 7 | 8 | 752 | 640 | 17.50% |
| 96 | 80 | 8 | 8 | 768 | 640 | 20.00% |
| 98 | 80 | 9 | 8 | 784 | 640 | 22.50% |
| 100 | 80 | 10 | 8 | 800 | 640 | 25.00% |
| 102 | 80 | 11 | 8 | 816 | 640 | 27.50% |
| 104 | 80 | 12 | 8 | 832 | 640 | 30.00% |
| 106 | 80 | 13 | 8 | 848 | 640 | 32.50% |
| 108 | 80 | 14 | 8 | 864 | 640 | 35.00% |
| ... | ... | ... | ... | ... | ... | ... |

TABLE 6-continued

RS (N, K, T, M)

| N | K | T | M | n | x | OH |
|---|---|---|---|---|---|---|
| 66 | 64 | 1 | 10 | 660 | 640 | 3.13% |
| 68 | 64 | 2 | 10 | 680 | 640 | 6.25% |
| 70 | 64 | 3 | 10 | 700 | 640 | 9.38% |
| 72 | 64 | 4 | 10 | 720 | 640 | 12.50% |
| 74 | 64 | 5 | 10 | 740 | 640 | 15.63% |
| 76 | 64 | 6 | 10 | 760 | 640 | 18.75% |
| 78 | 64 | 7 | 10 | 780 | 640 | 21.88% |
| 80 | 64 | 8 | 10 | 800 | 640 | 25.00% |
| 82 | 64 | 9 | 10 | 820 | 640 | 28.13% |
| 84 | 64 | 10 | 10 | 840 | 640 | 31.25% |
| 86 | 64 | 11 | 10 | 860 | 640 | 34.38% |
| ... | ... | ... | ... | ... | ... | ... |

Figures 13, 14:
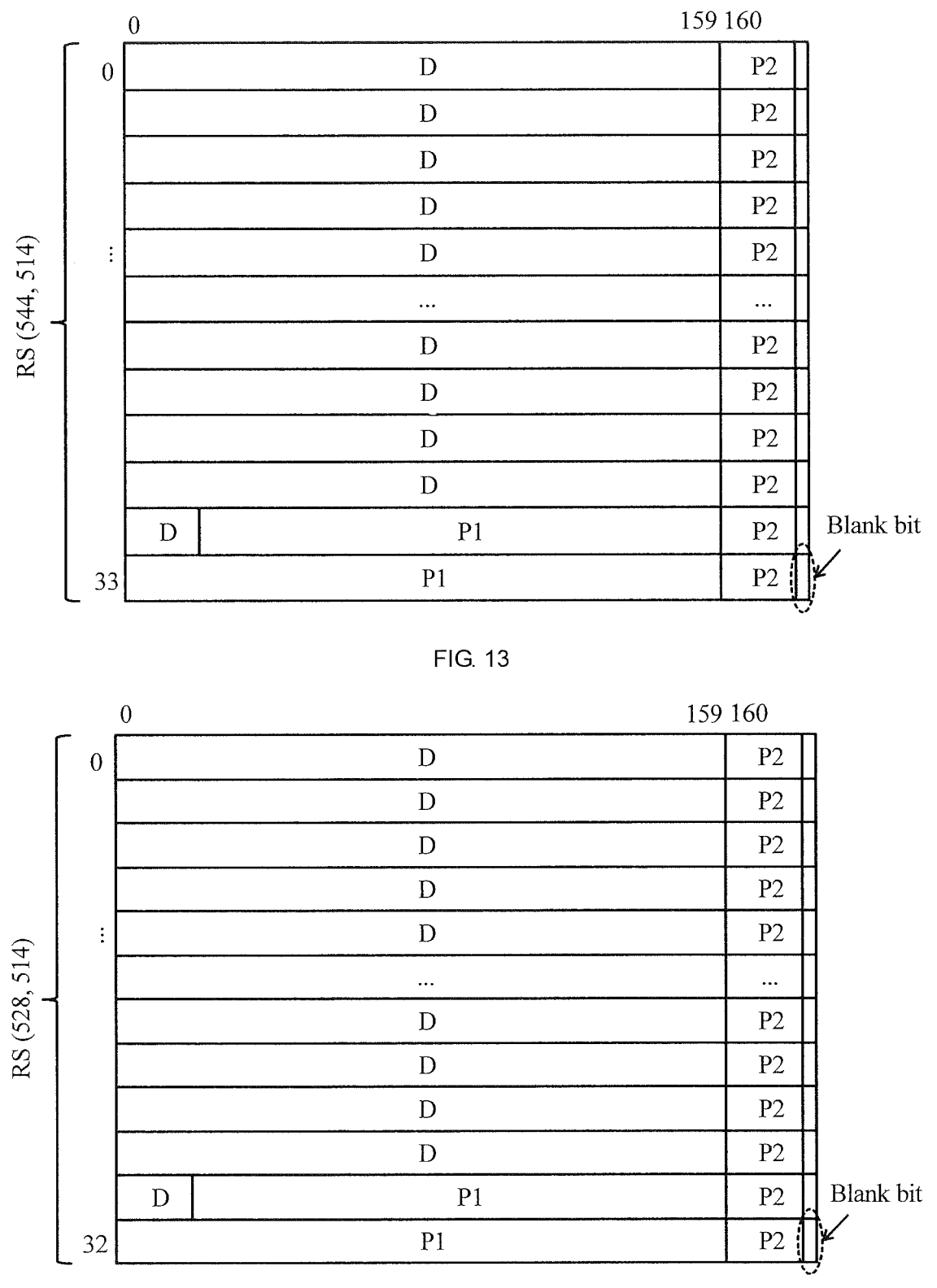

FIG. 13 or FIG. 14 is a schematic structural diagram of a frame of a cascaded code according to still another embodiment of this application. In FIG. 13 or FIG. 14, D represents a data information code of an outer code, P1 represents a check code of the outer code, and P2 represents a check code of an inner code. A quantity of bits of a data information code of each codeword of the inner code in FIG. 13 or FIG. 14 is 160 bits.

One frame of the outer code in FIG. 13 includes one codeword of an RS (544, 514) code. The RS (544, 514) codeword is divided by using W=160 bits as a granularity, and one frame of the RS (544, 514) code is exactly divided into Q=34 data blocks whose lengths are W=160 bits each.

One frame of the outer code in FIG. 14 includes one codeword of an RS (528, 514) code. One frame of the RS (528, 514) code is exactly divided into Q=33 data blocks whose lengths are W=160 bits each.

In a specific example, the inner code in the examples in FIG. 13 or FIG. 14 may be a BCH (n, x, t, m) code shown in Table 7, or an RS (N, K, T, M) code shown in Table 8. A length of a digital information code of each codeword of the BCH code in Table 7 and the RS code in Table 8 is 160 bits.

In this embodiment of this application, n represents a codeword length of each codeword, x represents a quantity of bits of a data information code in each codeword, t represents a quantity of bits that can be corrected in each codeword, m represents a dimension of a finite field of a codeword, N represents a quantity of codeword symbols of each codeword, K represents a quantity of codeword symbols of a data information code of each codeword, T represents a quantity of codeword symbols that can be corrected in each codeword, and M represents a quantity of bits of a codeword symbol of each codeword. OH represents a proportion of check codes or overheads.

In an example, a quantity of blank bits included in the inner code may be selected based on an actual link rate. For example, when a BCH (176, 160, 2) code is selected as the inner code, four blank bits may be added after each BCH code, and a codeword length of the BCH code is supplemented to 180 bits. In this case, a ratio of the codeword length of the inner code to a data information bit length is 180/160=9/8.

TABLE 7

BCH (n, x, t, m)

| n | x | t | m | OH |
|---|---|---|---|---|
| 176 | 160 | 2 | 8 | 10.00% |
| 184 | 160 | 3 | 8 | 15.00% |

TABLE 7-continued

BCH (n, x, t, m)

| n | x | t | m | OH |
|---|---|---|---|---|
| 192 | 160 | 4 | 8 | 20.00% |
| 200 | 160 | 5 | 8 | 25.00% |
| 208 | 160 | 6 | 8 | 30.00% |
| 216 | 160 | 7 | 8 | 35.00% |
| 178 | 160 | 2 | 9 | 11.25% |
| 187 | 160 | 3 | 9 | 16.88% |
| 196 | 160 | 4 | 9 | 22.50% |
| 205 | 160 | 5 | 9 | 28.13% |
| 214 | 160 | 6 | 9 | 33.75% |

TABLE 8

RS (N, K, T, M)

| N | K | T | M | n | x | OH |
|---|---|---|---|---|---|---|
| 22 | 20 | 1 | 8 | 176 | 160 | 10.00% |
| 24 | 20 | 2 | 8 | 192 | 160 | 20.00% |
| 26 | 20 | 3 | 8 | 208 | 160 | 30.00% |
| 28 | 20 | 4 | 8 | 224 | 160 | 40.00% |
| ... | ... | ... | ... | ... | ... | ... |
| 18 | 16 | 1 | 10 | 180 | 160 | 12.50% |
| 20 | 16 | 2 | 10 | 200 | 160 | 25.00% |
| 22 | 16 | 3 | 10 | 220 | 160 | 37.50% |
| ... | ... | ... | ... | ... | ... | ... |

Figure 15A:
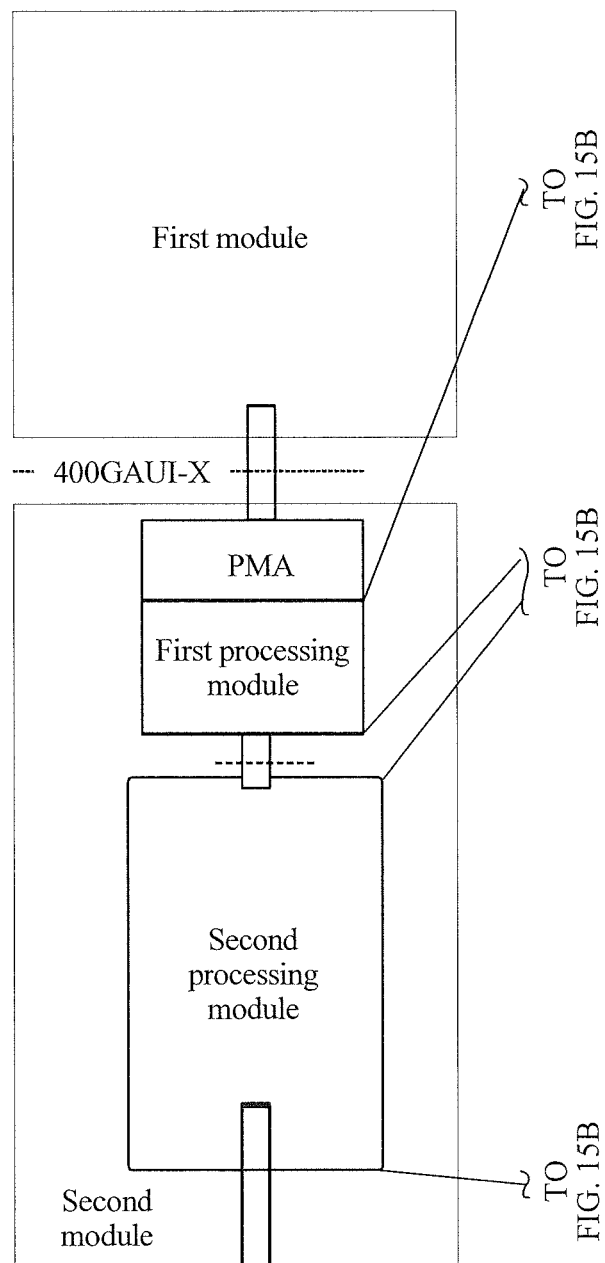
FIG. 15A and FIG. 15B are schematic diagrams of an encoding and decoding system according to another embodiment of this application.
Figure 15B:
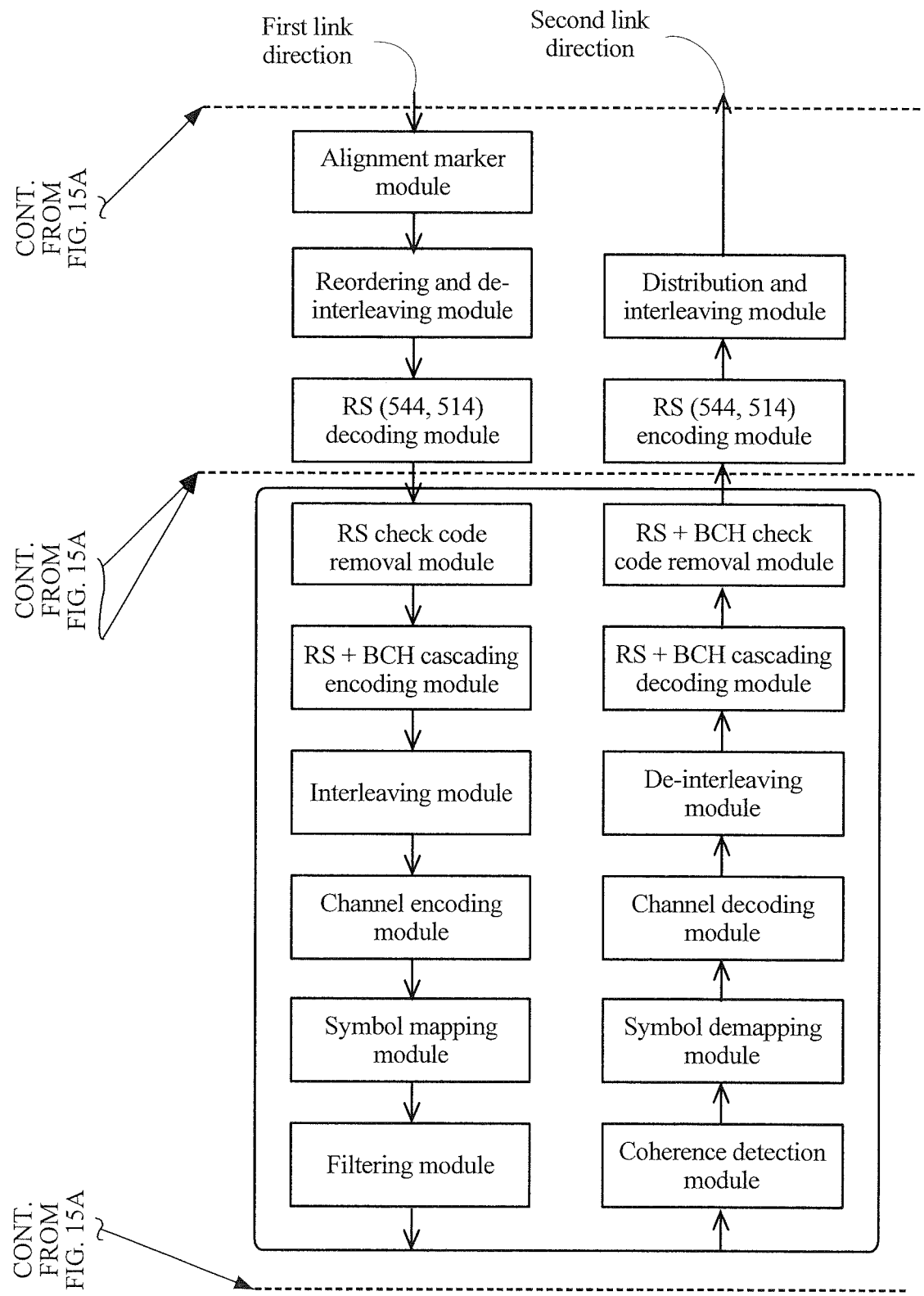

In a specific example, FIG. 15A and FIG. 15B are a schematic diagram of an encoding and decoding system according to still another embodiment of this application. FIG. 15A and FIG. 15B may be applied to a dense wavelength division multiplexing system that can provide a direct link between a router and a router. For example, a single carrier coherent demodulation 400 Gbps link may be used for the link. The encoding and decoding system in FIG. 15A and FIG. 15B can provide an FEC algorithm with a stronger error correction capability for the direct link, and has relatively low complexity, so that an encoding and decoding apparatus can be placed in an optical module.

An example in FIG. 15A and FIG. 15B includes a first module and a second module, where the first module may be an interface chip on a line card, the second module may be a chip in the optical module, and a communications interface between the first module and the second module may be referred to as 400GAUI-X. The first module supports RS (544, 514) encoding and decoding. The second module supports RS (544, 514)+BCH cascaded encoding and decoding.

In a first link direction shown in FIG. 15B, the first module sends an encoded RS (544, 514) codeword to the second module. After receiving the RS (544, 514) code, a decoding apparatus in the second module may decode the RS (544, 514) codeword and remove a check bit to obtain source data. Then, cascaded encoding is performed on the source data again by using an RS (544, 514)+BCH encoding apparatus.

In the first link direction of FIG. 15B, a process in which the second module receives data from the first module, decodes and encodes the data, and sends a signal to another device is as follows, and the following process may be executed by an internal module in the second module. The second module includes a physical medium attachment (physical medium attachment, PMA) module, a first processing module, and a second processing module. The second module may include the PMA module, the first processing module, and the second processing module. The first processing module may include at least one of the following modules: an alignment marker module, a reordering+de-interleaving module, or an RS (544, 514) decoding module. The second processing module may include an RS check code removal module, an RS+BCH cascaded encoding module, an interleaving module, a channel encoding module, a symbol mapping module, and a filtering module. The second processing module further includes at least one of the following modules: a coherence detection module, a symbol demapping module, a channel decoding module, a de-interleaving module, an RS+BCH decoding module, and or an RS+BCH check code removal module. The first processing module may further include at least one of the following modules: an RS (544, 514) encoding module or a distribution and interleaving module.

S1501. The 400GAUI-X communications interface receives a data stream, and inputs the data stream to a PMA layer to obtain N physical coding sublayer (physical coding sublayer, PCS) data streams.

S1502. Synchronize and align the N PCS data streams based on an internal alignment marker (alignment marxer, AM).

S1503. Perform channel reordering and de-interleaving on aligned data, and then input processed data into an RS (544, 514) decoder for decoding.

S1504. Remove a check code from data obtained after the RS (544, 514) code is decoded.

S1505. Send data obtained after the check code is removed from RS (544, 514) to an RS+BCH cascaded code encoder for encoding processing.

S1506. Perform interleaving, channel encoding, and symbol mapping on data obtained after RS+BCH cascaded code encoding, to generate a to-be-sent signal.

S1507. Optionally, perform Nyquist (Nyquist) filtering on the to-be-sent signal.

S1508. Send the filtered to-be-sent signal to a transmitter, and send a modulated to-be-sent signal to a channel for transmission.

In a second link direction of FIG. 15B, after decoding and encoding received data, the second module may send the received data to the first module. A specific process is as follows, and the following process may be executed by an internal module in the second module.

S1511. A receiver receives the signal from the channel and performs coherence detection on the signal.

S1512. Perform symbol demapping, channel decoding, and de-interleaving on a communication signal obtained through coherence detection, to generate a received data stream.

S1513. Perform RS+BCH cascaded code decoding on the received data stream to generate a decoded data stream.

S1514. Remove RS+BCH check data from the decoded data stream, and send the data stream to an RS (544, 514) encoder.

S1515. The RS (544, 514) encoder re-encodes the data.

S1516. Perform PMA layer distribution and interleaving on the data generated by the RS (544, 514) encoder, and then send the data to the communications interface for data transmission.

Figure 16A:
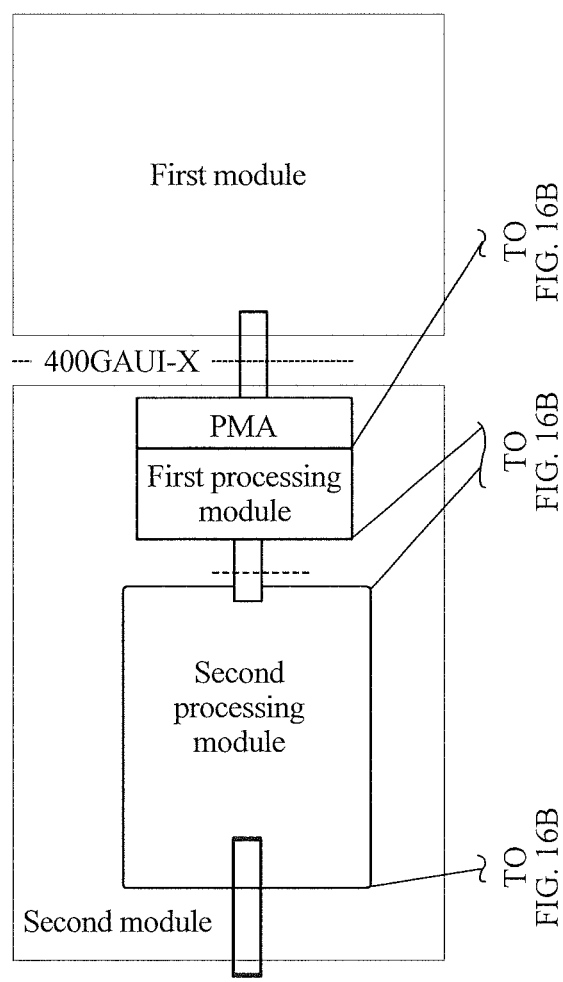
FIG. 16A and FIG. 16B are schematic diagrams of an encoding and decoding system according to still another embodiment of this application.
Figure 16B:
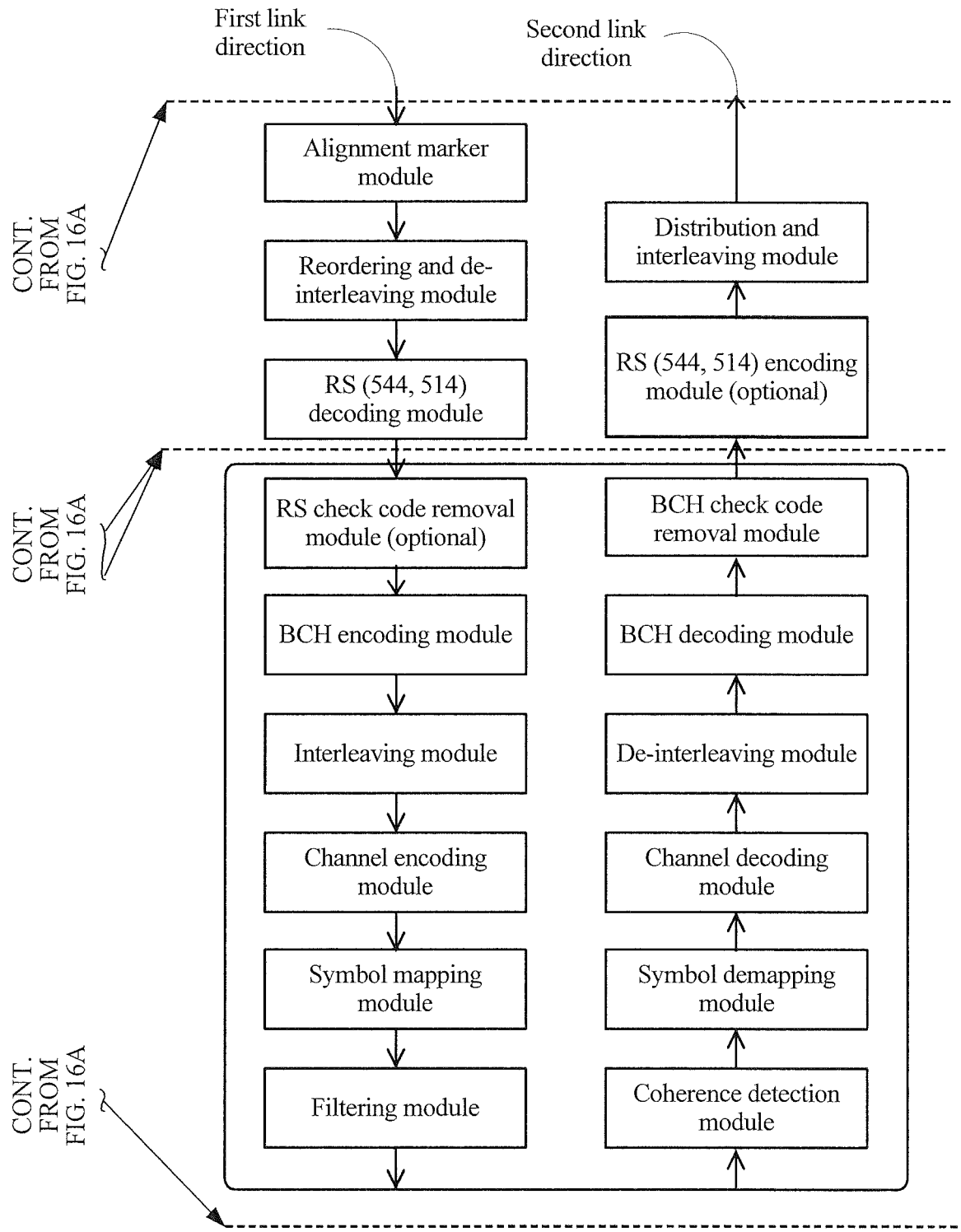

FIG. 16A and FIG. 16B are a schematic diagram of an encoding and decoding system according to still another embodiment of this application. An application scenario in FIG. 16A and FIG. 16B is similar to that in FIG. 15A and FIG. 15B, and details are not described herein again. An example in FIG. 16A and FIG. 16B includes a first module and a second module. A communications interface between the first module and the second module may be referred to as 400GAUI-X. The first module supports RS (544, 514) encoding and decoding. The second module supports RS (544, 514)+BCH cascaded encoding and decoding.

A difference between the example of FIG. 15A and FIG. 15B and the example of FIG. 16A and FIG. 16B lies in: In the encoding method in FIG. 16A and FIG. 16B, a codeword obtained after RS (544, 514) decoding may be directly reused, and a cascaded codeword is directly generated after BCH encoding. Codewords generated according to the two solutions shown in FIG. 15A and FIG. 15B and FIG. 16A and FIG. 16B may be identical.

In a first link direction of FIG. 16B, a process in which the second module receives data from the first module, decodes and encodes the data, and sends a signal to another device is as follows, and the following process may be executed by an internal module in the second module. The second module may include a PMA module, a first processing module, and a second processing module. The first processing module may include at least one of the following modules: an alignment marker module, a reordering+de-interleaving module, or an RS (544, 514) decoding module. The second processing module may include an RS check code removal module (optional), a BCH encoding module, an interleaving module, a channel encoding module, a symbol mapping module, and a filtering module. The second processing module further includes at least one of the following modules: a coherence detection module, a symbol demapping module, a channel decoding module, a de-interleaving module, a BCH decoding module, or a BCH check code removal module. The first processing module may further include at least one of the following modules: an RS (544, 514) encoding module (optional) or a distribution and interleaving module.

S1601. The communications interface receives a data stream transmitted by the first module, and inputs the data stream to a physical medium attachment (physical medium attachment, PMA) layer, to obtain N physical coding sublayer (physical coding sublayer, PCS) data streams.

S1602. Synchronize and align the N PCS data streams based on an internal alignment marker (alignment marxer, AM).

S1603. Perform channel reordering and de-interleaving on aligned data, and then input processed data into an RS (544, 514) decoder for decoding.

S1604. Optionally, reserve a check code for data obtained after RS (544, 514) decoding.

S1605. Send the data in which the check code is reserved in RS (544, 514) to the BCH encoder for cascaded encoding processing.

S1606. Perform interleaving, channel encoding, and symbol mapping on data obtained after RS+BCH cascaded code encoding, to generate a to-be-sent signal.

S1607. Optionally, perform Nyquist (Nyquist) filtering on the to-be-sent signal.

S1608. Send a filtered to-be-sent signal to a transmitter, and send a modulated to-be-sent signal to a channel for transmission.

In a second link direction of FIG. 16B, after decoding and encoding received data, the second module may send the received data to the first module. A specific procedure is as follows: the following procedure may be executed by an internal module in the second module.

S1611. A receiver receives the signal from the channel and performs coherence detection on the signal.

S1612. Perform symbol demapping, channel decoding, and de-interleaving on a communication signal obtained through coherence detection to generate a received data stream.

S1613. Perform BCH decoding on the received data stream to obtain a data stream decoded for the first time.

S1614. Remove a BCH check code from the data stream decoded for the first time, and then perform RS (544, 514) decoding, to obtain a data stream decoded for the second time.

S1615. Optionally, reserve an RS (544, 514) check code for the data stream decoded for the second time; and the RS (544, 514) encoder does not need to re-encode the data.

S1616. Perform distribution and interleaving on the data formed by an RS (544, 514) code in which the check code is reserved, and send the data to the communications interface for data transmission.

Figure 17:
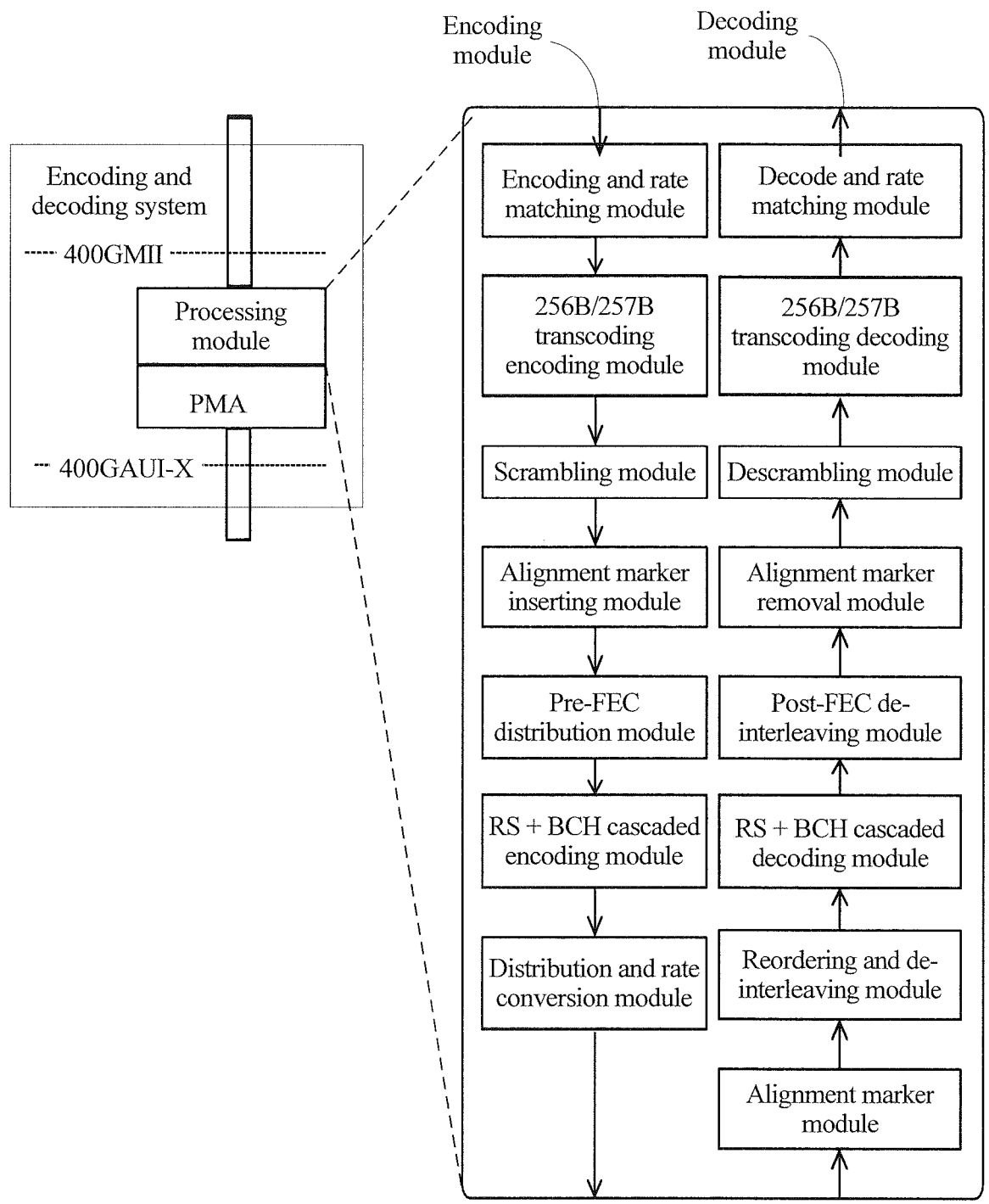
FIG. 17 is a schematic diagram of an encoding and decoding system according to still another embodiment of this application.

In a specific example, FIG. 17 is a schematic diagram of an encoding and decoding system according to still another embodiment. The encoding and decoding system includes a processing module, a PMA module, and two communications interfaces. The processing module includes an encoding module and a decoding module. The encoding module may include at least one of the following modules: an encoding and rate matching module, a 256B/257B transcoding encoding module, a scrambling module, an alignment marker inserting module, a Pre-FEC distribution module, an RS+BCH cascaded encoding module, or a distribution and rate conversion module. Optionally, the decoding module may include at least one of the following modules: an alignment marker module, a reordering+de-interleaving module, an RS+BCH cascaded decoding module, a post-FEC (Post-FEC) de-interleaving module, an alignment marker removal module, a descrambling module, a 256B/257B transcoding decoding module, or a decoding and rate matching module. The two communications interfaces may be referred to as a 400GMII interface and a 400GAUI-X interface. In the current 400GE Ethernet, RS (544, 514) is used as a FEC codeword. A next generation 400GE and a future 800GE and 1.6 TbE require a higher-performance FEC algorithm. The encoding and decoding method in FIG. 17 can be applied to the 400GE, the 800GE, and the 1.6 TbE (that is, the 400G Ethernet, the 800G Ethernet, and the 1.6 Tb Ethernet).

A data processing procedure of the encoding method in FIG. 17 is as follows:

S1701. Perform 64B66B encoding on a 64B (B represents a bit) data block to generate a 66B code block.

S1702. Generate a 257B code block after four 66B code blocks pass through a 256B257B transcoding encoder.

S1703. Scramble the 257B code block stream by using a scrambling module.

S1704. Insert an AM alignment marker into the scrambled 257B code block stream to form N PCS channel data streams.

S1705. Distribute the N PCS channel streams to M RS+BCH encoders by using the pre-FEC distribution module for cascaded encoding; twenty 257B code blocks, 5140B in total, form a data part of a codeword; and N FEC data streams are formed through encoding.

S1706. Perform distribution and rate conversion on the FEC data streams, and transmit the data streams to the communications interface for transmission.

A data processing procedure of the decoding method in FIG. 17 is as follows:

S1711. The 400GAUI-X interface inputs the data streams, and the data streams become N PCS bit streams after passing through the PMA layer.

S1712. Synchronize and align the N PCS bit streams based on an internal AM alignment marker.

S1713. Perform channel reordering and de-interleaving on the aligned data, and then send the data to M RS+BCH decoders for decoding, where N FEC data streams are formed after decoding.

S1714. Perform de-interleaving on the N FEC data streams by using a post-FEC de-interleaving module to restore the N PCS data streams.

S1715. Descramble the N PCS data streams obtained after the AM alignment marker is removed, to generate the 257B data block stream.

S1716. Restore the 257B data block stream to four 66B data blocks by using a 256B257B transcoding decoder.

S1717. Perform 64B668 decoding on the 66B data block to generate a 64B data block.

Figure 18:
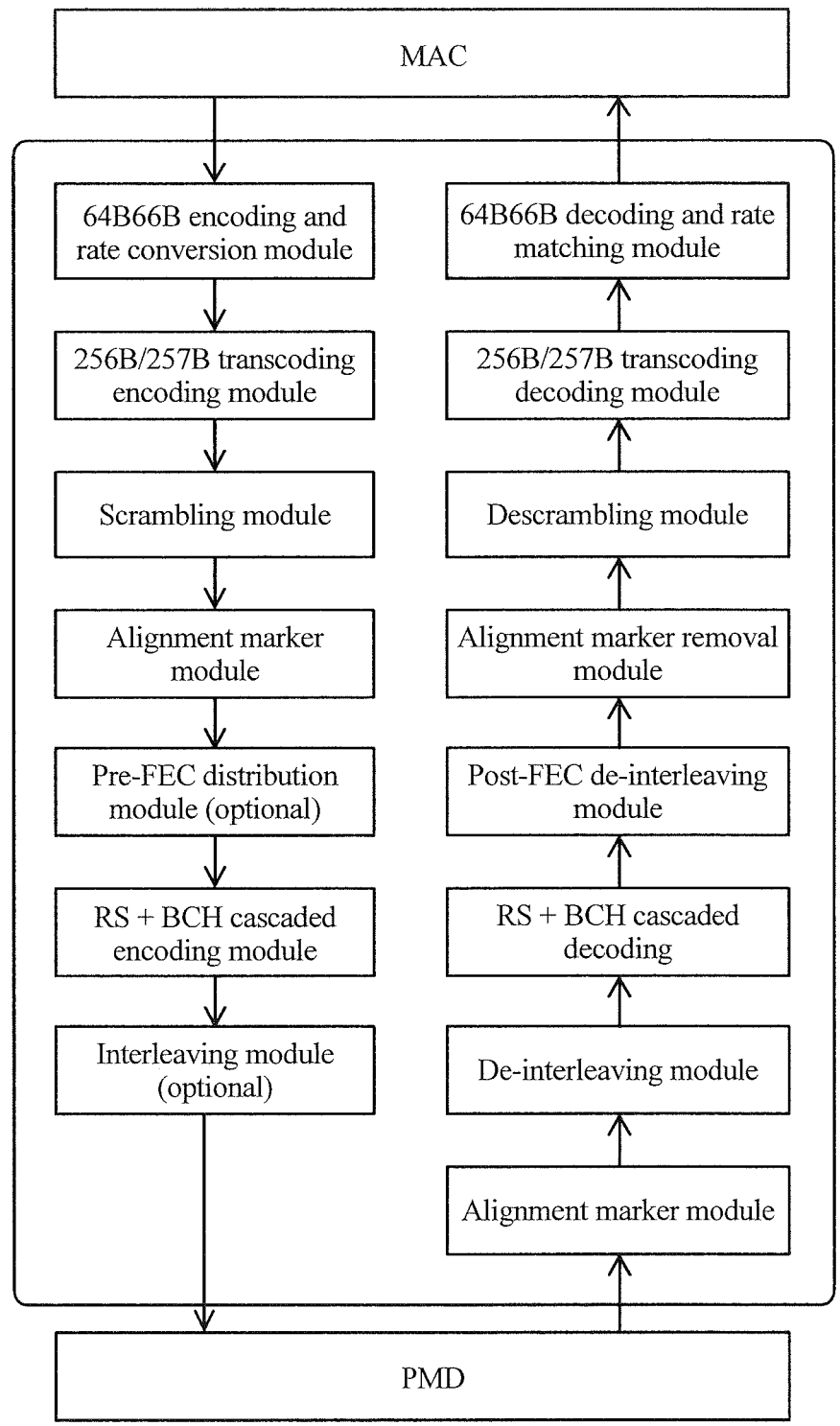
FIG. 18 is a schematic diagram of an encoding and decoding system according to still another embodiment of this application.

FIG. 18 is a schematic diagram of an encoding and decoding system according to still another embodiment of this application. The encoding and decoding system in FIG. 18 may be applied to a backplane link. The encoding and decoding system includes a media access control (media access control, MAC) module and a physical media dependent (physical media dependent, PMD) module. The encoding and decoding system includes at least one of the following modules: a 64B66B encoding and rate matching module, a 256B/257B transcoding encoding module, a scrambling module, an alignment marker module, a pre-FEC distribution module, an RS+BCH cascaded encoding module, or an interleaving module. Optionally, the encoding and decoding system may further include at least one of the following modules: an alignment marker module, a de-interleaving module, an RS+BCH cascaded decoding module, a post-FEC de-interleaving module, an alignment marker removal module, a descrambling module, a transcoding decoding module, or a 64B66B decoding and rate matching module.

In FIG. 18, a processing procedure of the encoding method is as follows:

S1801. Encode, by using a 64B66B encoding module, a 64B data block stream input by the MAC module, to generate a 66B data block.

S1802. Encode four 66B data blocks by using a 256B/257B transcoding encoding module to generate a 257B data block.

S1803. The 257B data block stream passes through the scrambling module to generate a scrambled 257B data block stream.

S1804. Optionally, synchronize and align the scrambled 257B data block stream.

S1805. Optionally, perform codeword interleaving on the 257B data block stream, and disperse the data block stream to M RS+BCH encoders, where M≥1.

S1806. The M RS+BCH encoders encode a large data block composed of 20 257B data blocks.

S1807. Optionally, the encoded data is distributed to N data channels (PMD) for transmission, where N≥1.

In FIG. 18, a processing procedure of the decoding method is as follows:

S1811. Receive the data by using the N data channels (PMD), and perform channel alignment on the data, where N≥1. This step is mandatory when N>1, and is optional when N=1.

S1812. Perform de-interleaving on the aligned N data channels, and then send the data to M RS+BCH decoders for decoding. This step is mandatory when N>1, and is optional when N=1.

S1813. Perform post-FEC de-interleaving on the data decoded by using the M RS+BCH decoders to generate the N data channels. This step is mandatory when N>1, and is optional when N=1.

S1814. Remove AM alignment markers from the N data channels. This step is mandatory when N>1, and is optional when N=1.

S1815. Perform descrambling restoration on the N data channels obtained after the AM alignment markers are removed, to obtain the 257B data block stream.

S1816. Restore the 257B data block stream to four 66B data block streams by using the 256B/257B decoding module.

S1817. Input the 66B data block stream to a 64B66B decoding module to be restored to a 64B data block and sent to the MAC module.

With reference to the accompanying drawings, the following describes an encoding and decoding apparatus according to the embodiments of this application.

Figure 19:
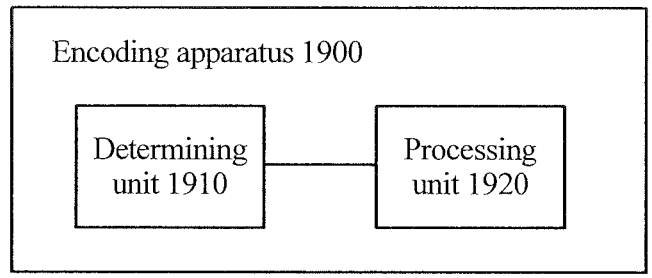
FIG. 19 is a schematic diagram of an encoding apparatus according to an embodiment of this application.

FIG. 19 is a schematic block diagram of an encoding apparatus according to an embodiment of this application. The encoding apparatus 1900 in FIG. 19 includes a determining unit 1910 and a processing unit 1920.

The determining unit 1910 is configured to determine a frame of an outer code of to-be-encoded data, where the frame of the outer code includes a data information code and a check code of the data information code, the frame of the outer code is divided into Q data blocks, each data block in the Q data blocks includes W bits, and W and Q are integers greater than 0.

The processing unit 1920 is configured to encode the Q data blocks to obtain Q codewords of an inner code, where the Q data blocks are in a one-to-one correspondence with the Q codewords of the inner code, a first codeword in the Q codewords of the inner code includes a first data block and a check code of the first data block, the first codeword is any codeword in the Q codewords of the inner code, and the first data block is a data block corresponding to the first codeword.

Figure 20:
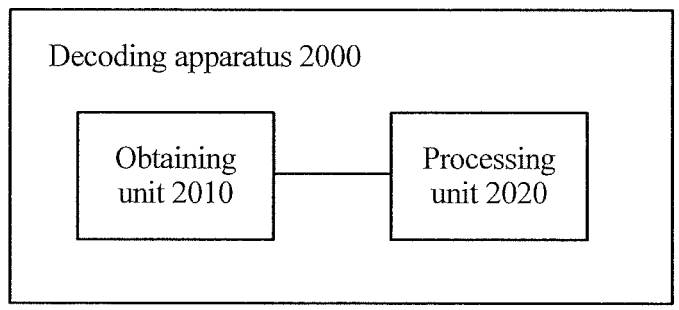
FIG. 20 is a schematic diagram of a decoding apparatus according to an embodiment of this application.

FIG. 20 is a schematic structural diagram of a decoding apparatus 2000 according to an embodiment of this application. The decoding apparatus in FIG. 20 includes an obtaining unit 2010 and a processing unit 2020.

The obtaining unit 2010 is configured to obtain Q codewords of an inner code of to-be-decoded data, where the Q codewords of the inner code are in a one-to-one correspondence with Q data blocks included in a frame of an outer code, a first codeword in the Q codewords of the inner code includes a first data block and a check code of the first data block, the first codeword is any codeword in the Q codewords of the inner code, and the first data block is a data block corresponding to the first codeword.

The processing unit 2020 is configured to: decode the Q codewords of the inner code to obtain the frame of the outer code, where the frame of the outer code is divided into the Q data blocks, each data block in the Q data blocks includes W bits, and W and Q are integers greater than 0; and decode the frame of the outer code to obtain decoded data.

Figure 21:
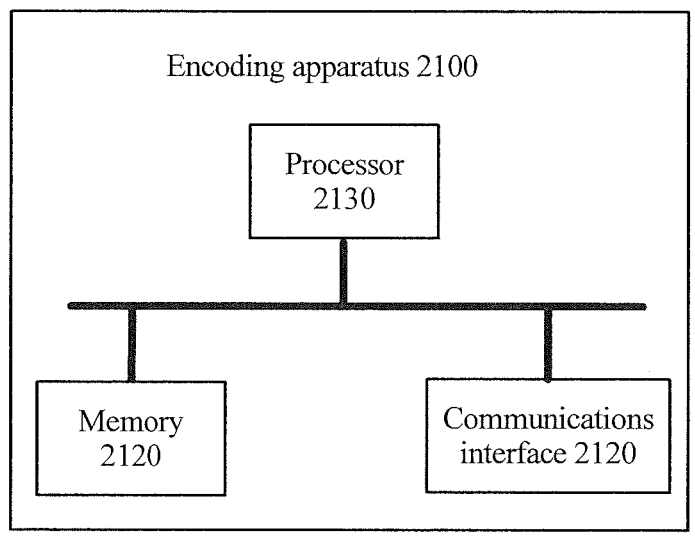
FIG. 21 is a schematic diagram of an encoding apparatus according to another embodiment of this application.

FIG. 21 is a schematic block diagram of an encoding apparatus 2100 according to an embodiment of the present invention. It should be understood that the encoding apparatus 2100 can perform the steps of the foregoing encoding method. To avoid repetition, details are not described herein again. The encoding apparatus 2100 includes:

a memory 2110, configured to store a program; and a communications interface 2120, configured to communicate with another device; and a processor 2130, configured to execute the program in the memory 2110, where when the program is executed, the processor 2130 is configured to determine a frame of an outer code of to-be-encoded data, where the frame of the outer code includes a data information code and a check code of the data information code, the frame of the outer code is divided into Q data blocks, each data block in the Q data blocks includes W bits, and W and Q are integers greater than 0; where the processor 2130 is further configured to encode the Q data blocks to obtain Q codewords of an inner code, where the Q data blocks are in a one-to-one correspondence with the Q codewords of the inner code, a first codeword in the Q codewords of the inner code includes a first data block and a check code of the first data block, the first codeword is any codeword in the Q codewords of the inner code, and the first data block is a data block corresponding to the first codeword.

Figure 22:
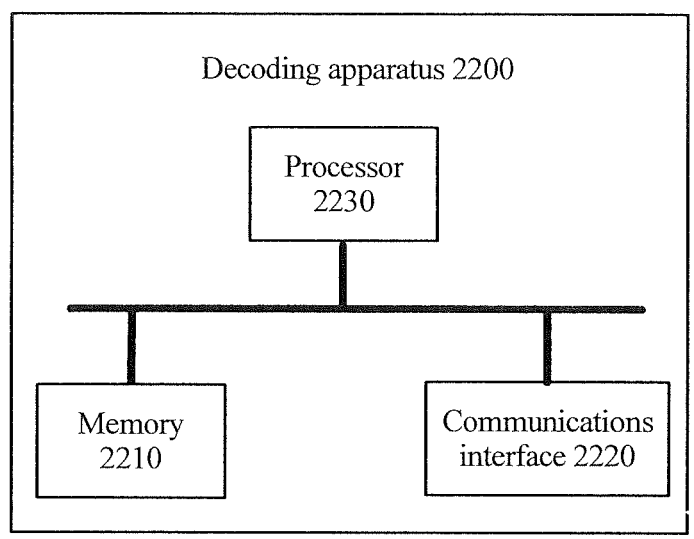
FIG. 22 is a schematic diagram of a decoding apparatus according to another embodiment of this application.

FIG. 22 is a schematic block diagram of a decoding apparatus 2200 according to an embodiment of the present invention. It should be understood that the decoding apparatus 2200 can perform the steps of the foregoing decoding method. To avoid repetition, details are not described herein again. The decoding apparatus 2200 includes:

a memory 2210, configured to store a program; and a communications interface 2220, configured to communicate with another device; and a processor 2230, configured to execute the program in the memory 2210, where when the program is executed, the processor 2230 is configured to: obtain Q codewords of an inner code of to-be-decoded data, where the Q codewords of the inner code are in a one-to-one correspondence with Q data blocks included in a frame of an outer code, a first codeword in the Q codewords of the inner code includes a first data block and a check code of the first data block, the first codeword is any codeword in the Q codewords of the inner code, and the first data block is a data block corresponding to the first codeword; decode the Q codewords of the inner code to obtain the frame of the outer code, where the frame of the outer code is divided into the Q data blocks, each data block in the Q data blocks includes W bits, and W and Q are integers greater than 0; and decode the frame of the outer code to obtain decoded data.

A person of ordinary skill in the art may be aware that, the units and algorithm steps in the examples described with reference to the embodiments disclosed in this specification may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the system, apparatus, and unit, refer to a corresponding process in the method embodiments. Details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units may be integrated into one unit.

When the functions are implemented in a form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (read-only memory, ROM), a random access memory (random access memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An encoding method, comprising:
    determining a frame of an outer code of to-be-encoded data, wherein the frame of the outer code comprises plural codewords of the outer code, wherein each codeword of the outer code includes a data block and a parity block, the frame of the outer code includes Q data blocks, each of the Q data blocks comprises W bits, and W and Q are integers greater than 0; and
    encoding the Q data blocks to obtain Q codewords of an inner code, wherein the Q data blocks are in a one-to-one correspondence with the Q codewords of the inner code, a first codeword in the Q codewords of the inner code comprises a first data block and a parity block of the first data block, the first codeword is any codeword in the Q codewords of the inner code, and the first data block is a data block corresponding to the first codeword.

2. The method according to claim 1, wherein the method further comprises:
    adding at least one blank bit to each frame of the Q codewords of the inner code, wherein the at least one blank bit is used to adjust an overall codeword rate.

3. The method according to claim 1, wherein the method further comprises: performing precoding based on the Q codewords of the inner code to obtain precoded data.

4. The method according to claim 1, wherein the determining the frame of the outer code of to-be-encoded data comprises:
    obtaining the to-be-encoded data; and
    encoding the to-be-encoded data to obtain the frame of the outer code.

5. The method according to claim 1, wherein the outer code is a Reed Solomon RS code.

6. The method according to claim 5, wherein the frame of the outer code comprises Y codewords of the RS code, Y*N*M=Q*W, N is a quantity of codeword symbols of the RS code, K is a quantity of information symbols of the RS (N, K) code, M is a quantity of bits comprised in each codeword symbol of the RS code, and Y, M, and N are integers greater than 0.

7. The method according to claim 6, wherein N=544, and K=514; or N=528, and K=514; or N=271, and K=257.

8. A decoding method, comprising:
    obtaining Q codewords of an inner code of to-be-decoded data, wherein the Q codewords of the inner code are in a one-to-one correspondence with Q data blocks which comprise a frame of an outer code, a first codeword in the Q codewords of the inner code comprises a first data block and a parity block of the first data block, the first codeword is any codeword in the Q codewords of the inner code, and the first data block is a data block corresponding to the first codeword;
    decoding the Q codewords of the inner code to obtain the frame of the outer code, wherein the frame of the outer code comprises the Q data blocks, each of the Q data blocks comprises W bits, and W and Q are integers greater than 0; and
    decoding the frame of the outer code to obtain decoded data.

9. The method according to claim 8, wherein the Q codewords of the inner code further comprise at least one blank bit, and the at least one blank bit is used to adjust an overall codeword rate.

10. The method according to claim 8, wherein before the obtaining of the Q codewords of the inner code of the to-be-decoded data, the method further comprises:
    obtaining the to-be-decoded data; and
    performing decoding processing on precoding of the to-be-decoded data to obtain the Q codewords of the inner code.

11. The method according to claim 8, wherein the outer code is a Reed Solomon RS code.

12. The method according to claim 11, wherein the frame of the outer code comprises Y codewords of the RS code, Y*N*M=Q*W, N is a quantity of codeword symbols comprised in each codeword of the RS code, M is a quantity of bits comprised in each codeword symbol of the RS code, and Y, M, and N are integers greater than 0.

13. The method according to claim 12, wherein N=544, and K=514; or N=528, and K=514; or N=271, and K=257.

14. An encoding apparatus, comprising a determining unit and a processing unit, wherein
    the determining unit is configured to determine a frame of an outer code of to-be-encoded data, wherein the frame of the outer code comprises plural code words of the outer code, wherein each code word of the outer code comprises a data block and parity code of Q data blocks, each data block in the Q data blocks comprises W bits, and W and Q are integers greater than 0; and the processing unit is configured to encode the Q data blocks to obtain Q codewords of an inner code, wherein the Q data blocks are in a one-to-one correspondence with the Q codewords of the inner code, a first codeword in the Q codewords of the inner code comprises a first data block and a check code of the first data block, the first codeword is any codeword in the Q codewords of the inner code, and the first data block is a data block corresponding to the first codeword.

15. The apparatus according to claim 14, wherein the processing unit is further configured to add at least one blank bit to each frame of the Q codewords of the inner code, wherein the at least one blank bit is used to adjust an overall codeword rate.

16. The apparatus according to claim 14, wherein the processing unit is further configured to perform precoding based on the Q codewords of the inner code to obtain precoded data.

17. The apparatus according to claim 14, wherein determining the frame of the outer code of the to-be-encoded data, the determining unit is configured to: obtain the to-be-encoded data; and encode the to-be-encoded data to obtain the frame of the outer code.

18. The apparatus according to claim 14, wherein the outer code is a Reed Solomon RS code.

19. The apparatus according to claim 18, wherein the frame of the outer code comprises Y codewords of the RS code, Y*N*M=Q*W, N is a quantity of codeword symbols of the RS code, K is a quantity of information symbols of the RS (N, K) code, M is a quantity of bits comprised in each codeword symbol of the RS code, and Y, M, and N are integers greater than 0.

20. The apparatus according to claim 19, wherein N=544, and K=514; or N=528, and K=514; or N=271, and K=257.

* * * * *